(12) United States Patent  
Attlesey

(10) Patent No.: US 7,905,106 B2
(45) Date of Patent: Mar. 15, 2011

(54) CASE AND RACK SYSTEM FOR LIQUID SUBMERSION COOLING OF ELECTRONIC DEVICES CONNECTED IN AN ARRAY

(75) Inventor: Chad Daniel Attlesey, Rochester, MN (US)

(73) Assignee: Hardcore Computer, Inc., Rochester, MN (US)

( * ) Notice: Subject to any disclaimer, the term of this patent is extended or adjusted under 35 U.S.C. 154(b) by 120 days.

(21) Appl. No.: 12/416,399

(22) Filed: Apr. 1, 2009

(65) Prior Publication Data

US 2009/0260777 A1 Oct. 22, 2009

Related U.S. Application Data

(60) Provisional application No. 61/046,540, filed on Apr. 21, 2008, provisional application No. 61/085,934, filed on Aug. 4, 2008.

(51) Int. Cl.
| | |
|---|---|
| F25D 23/12 | (2006.01) |
| F28F 7/00 | (2006.01) |
| F28D 15/00 | (2006.01) |
| H05K 7/20 | (2006.01) |

(52) U.S. Cl. .............. 62/259.2; 165/80.4; 165/104.33; 361/699; 361/700

(58) Field of Classification Search ............... 62/259.2; 165/80.4, 104.33; 361/699, 700, 701, 702, 361/719; 174/15.1, 15.2
See application file for complete search history.

(56) References Cited

U.S. PATENT DOCUMENTS

| | | | |
|---|---|---|---|
| 4,302,793 A | * | 11/1981 | Rohner ............... 361/699 |
| 4,493,010 A | | 1/1985 | Morrison et al. |
| 4,741,385 A | | 5/1988 | Bergles et al. |
| 4,765,397 A | | 8/1988 | Chrysler et al. |
| 5,021,924 A | | 6/1991 | Kieda et al. |

(Continued)

FOREIGN PATENT DOCUMENTS

| | | |
|---|---|---|
| KR | 2003-0019849 A | 3/2003 |
| WO | 2010/019517 | 2/2010 |
| WO | 2010/046151 | 4/2010 |

OTHER PUBLICATIONS

"Strip Out the Fans, Add 8 Gallons of Cooking Oil/ Tom's Hardware" http://www.tomshardware.com/2006/01/09/strip_out_the_fans/ Aug. 1, 2007 p. 1-30.

(Continued)

*Primary Examiner* — Frantz F Jules
*Assistant Examiner* — Daniel C Comings
(74) *Attorney, Agent, or Firm* — Hamre, Schumann, Mueller & Larson, P.C.

(57) ABSTRACT

A liquid submersion cooling system that is suitable for cooling a number of electronic devices in parallel using a plurality of cases connected to a rack system. The system cools heat-generating components in server computers and other devices that use electronic, heat-generating components and are connected in parallel systems. The system includes a housing having an interior space, a dielectric cooling liquid in the interior space, a heat-generating electronic component disposed within the space and submerged in the dielectric cooling liquid. The rack system contains a manifold system to engage and allow liquid transfer for multiple cases and IO connectors to engage electrically with multiple cases/electronic devices. The rack system can be connected to a pump system for pumping the liquid into and out of the rack, to and from external heat exchangers, heat pumps, or other thermal dissipation/recovery devices.

18 Claims, 19 Drawing Sheets

U.S. PATENT DOCUMENTS

| | | | | |
|---|---|---|---|---|
| 5,131,233 | A | * | 7/1992 | Cray et al. ............... 165/80.4 |
| 5,212,626 | A | | 5/1993 | Bell et al. |
| 6,333,849 | B1 | | 12/2001 | Donahoe et al. |
| 6,580,609 | B2 | * | 6/2003 | Pautsch ............... 361/698 |
| 6,807,056 | B2 | | 10/2004 | Kondo et al. |
| 6,938,678 | B1 | | 9/2005 | Bortolini et al. |
| 6,947,282 | B2 | | 9/2005 | Hotta et al. |
| 7,236,363 | B2 | | 6/2007 | Belady |
| 7,295,436 | B2 | | 11/2007 | Cheon |
| 7,317,619 | B2 | | 1/2008 | Karstens |
| 7,403,392 | B2 | | 7/2008 | Attlesey et al. |
| 7,414,845 | B2 | | 8/2008 | Attlesey et al. |
| 7,564,685 | B2 | | 7/2009 | Clidaras et al. |
| 7,609,518 | B2 | | 10/2009 | Hopton et al. |
| 7,724,517 | B2 | | 5/2010 | Attlesey et al. |
| 7,724,524 | B1 | | 5/2010 | Campbell et al. |
| 2004/0221604 | A1 | | 11/2004 | Ota et al. |
| 2005/0097918 | A1 | * | 5/2005 | Thurman ............... 62/246 |
| 2006/0067047 | A1 | * | 3/2006 | Pfahnl ............... 361/687 |
| 2006/0126296 | A1 | * | 6/2006 | Campbell et al. ......... 361/700 |
| 2006/0273814 | A1 | * | 12/2006 | Rapp ............... 324/763 |
| 2007/0034360 | A1 | | 2/2007 | Hall |
| 2007/0227710 | A1 | | 10/2007 | Belady et al. |
| 2008/0123297 | A1 | | 5/2008 | Tilton et al. |
| 2008/0196870 | A1 | | 8/2008 | Attlesey et al. |
| 2010/0101765 | A1 | | 4/2010 | Campbell et al. |
| 2010/0103614 | A1 | | 4/2010 | Campbell et al. |
| 2010/0103618 | A1 | | 4/2010 | Campbell et al. |
| 2010/0103620 | A1 | | 4/2010 | Campbell et al. |
| 2010/0226094 | A1 | | 9/2010 | Attlesey et al. |
| 2010/0246118 | A1 | | 9/2010 | Attlesey |

OTHER PUBLICATIONS

"Koolance Superior Liquid Cooling Systems" PSU-1200ATX-12S User Manual, English 1.01, p. 1-10.

International Search Report of PCT/US2009/039086, dated Nov. 12, 2009.

Written Opinion of the International Searching Authority of PCT/US2009/039086, dated Nov. 12, 209.

"Green Revolution Cooling CarnotJet System" video by Green Revolution Cooling, located online at http://www.youtube.com/watch?v=-q0sTFXIDFM and accessed Jun. 23, 2010 (also saved and submitted herewith on enclosed DVD).

"Liquid Cooled Server Rack" video by Iceotope, located online at http://www.youtube.com/watch?v=K5e9_cqFiNE and accessed Jun. 23, 2010 (also saved and submitted herewith on enclosed DVD).

"Green Revolution Cooling: The most efficient data center cooling solution available" by Green Revolution Cooling, Inc., 2009, (2 pages).

Donoghue, Andrew, "Server Cool-Bags Could Cut Costs by 93 Percent," eWEEK Europe UK, located at http://www.eweekeurope.co.uk/news/news-it-infrastructure/server-cool-bags-could-cut-costs-by-93-percent-2472, Nov. 17, 2009. (3 pages).

Dillow, Clay, "Liquid Cooling Bags For Data Centers Could Trim Cost and Carbon by 90 Percent," Popular Science, located at http://www.popsci.com/science/article/2009-11/liquid-coolant-system-data-centers-could-trim-cost-carbon-90-percent, Nov. 17, 2009 (3 pages).

U.S. Appl. No. 12/795,854, filed Jun. 8, 2010.

Tuma. Phillip, "The Merits of Open Bath Immersion Cooling of Datacom Equipment"; 26th IEEE Semi-therm Symposium; 2010; 9 pages.

"The Benefits of Using Open Bath Evaporative Immersion Cooling" obtained from http://www.datacenterdynamics.com/MF2/Audiences/Segments/Publications, May 13, 2010; 4 pages.

U.S. Appl. No. 12/902375, filed Oct. 12, 2010, Attlesey et al.

* cited by examiner

CASE AND RACK SYSTEM FOR LIQUID SUBMERSION COOLING OF ELECTRONIC DEVICES CONNECTED IN AN ARRAY

This application claims the benefit of U.S. Provisional Application Nos. 61/085,934 filed Aug. 4, 2008, and 61/046,540 filed Apr. 21, 2008, each of which is incorporated by reference herein in its entirety.

TECHNICAL FIELD

This disclosure relates to a liquid submersion-cooled electronic array system, and in particular, to a case that is used in a liquid submersion-cooled electronic device, for example, a computer server, where many individual logic boards, in individual cases, or logic boards grouped together in a single case, can be contained within a rack system.

BACKGROUND

A significant problem facing the computer industry is heat. The higher the temperature a component operates at, the more likely it is to fail. Electronics that are operating under high temperature conditions have a shorter life expectancy than components maintained at lower operating temperatures. Generally, it holds true that the higher the temperature of operation, the shorter the component life expectancy. Also, high temperatures, while not causing catastrophic failures, can create data processing errors. Operation at high temperatures can cause power fluctuations that lead to these errors within a central processing unit (CPU) or on the logic board anywhere that data management is handled. Despite efforts at reducing waste heat while increasing processing power, each new CPU and graphics processing unit (GPU) released on the market runs hotter than the last. Power supply and logic board components required to provide power and handle signal processing also are producing more and more heat with every new generation.

The use of liquids in cooling systems to cool computer systems is known. One known method of cooling computer components employs a closed-loop, 2-phase system. The vapor travels through a tube to a cooling chamber, the vapor turns back into liquid, and the liquid is returned by tube to the chips for further cooling. In another known liquid cooling system, internal pumps move liquid past a hot plate on a CPU and then the heated liquid is pumped into a finned tower that passively cools the liquid and returns it to the plate.

In the case of large-scale, fixed-installation supercomputers, it is known to submerge the active processing components of the supercomputer in inert, dielectric fluid. The fluid is typically allowed to flow through the active components and then it is pumped to external heat exchangers where the fluid is cooled before being returned to the main chamber.

Despite prior attempts to cool computer components, further improvements to cooling systems are necessary.

SUMMARY

An individually contained liquid submersion-cooled system is described that is suitable for cooling a number of electronic devices, including cooling heat-generating components in computer systems and other systems that use electronic, heat-generating components. Examples of electronic devices to which the concepts described herein can be applied include, but are not limited to: servers including blade servers; disk arrays/storage systems; storage area networks; network attached storage; storage communication systems; work stations; routers; telecommunication infrastructure/switches; wired, optical and wireless communication devices; cell processor devices; printers; power supplies; displays; optical devices; instrumentation systems, including hand-held systems; military electronics; etc.

The electronic device can include a case having an interior space. A dielectric cooling liquid is contained in the interior space, and a heat-generating electronic component is disposed within the space and is submerged in the dielectric cooling liquid or dielectric cooling liquid is directed over the component.

When the electronic device is a computer, for example, a server computer, a single logic board or a plurality of logic boards are disposed within the interior space. The logic board(s) includes a number of heat-generating electronic components, including at least one processor, for example, a CPU or a GPU. In addition, other heat-generating components of the computer can be submerged in the cooling liquid, for example, RAM, power supply, daughter cards and storage drives such as solid-state drives or mechanical hard drives.

In one embodiment, the electronic components need not actually be submerged in the cooling liquid. Instead, the cooling liquid can be "poured" or otherwise directed over the electronic component(s), with gravity assisting the liquid to flow downward over the component(s), with the liquid thereafter being collected in a sump where it is pumped to a thermal dissipation/recovery device for eventual return back to the electronic component(s). This embodiment would reduce the amount of cooling liquid within the case, thereby reducing weight and cost.

The case containing the computer logic board(s), daughter cards, power supplies and other active electronic components includes a plurality of walls defining a liquid-tight interior space. If desired, one or more of the walls can be a transparent, a translucent, or an opaque material. A lid, which can be removable or fixed, closes the interior space, for example the top of the space. The lid forms a liquid-tight seal with the plurality of walls, and in one embodiment the lid includes a sealed electrical connector fixed thereto that is configured to attach to the logic board disposed in the interior space and to provide electrical connection between the logic board and an exterior of the case.

In an embodiment, when the logic board is lifted from the interior space, a mechanism can also be provided to hold the logic board in its raised position for changing out logic board components and allowing liquid to drain back into the interior space.

The aforementioned case with the aforementioned interior space may align with other cases with similar interior spaces to form an array of cases that can be used for logic boards on servers, storage systems (including disk drives), routers, communications devices, and other electronic devices.

DRAWINGS

DETAILED DESCRIPTION

Figure 1:
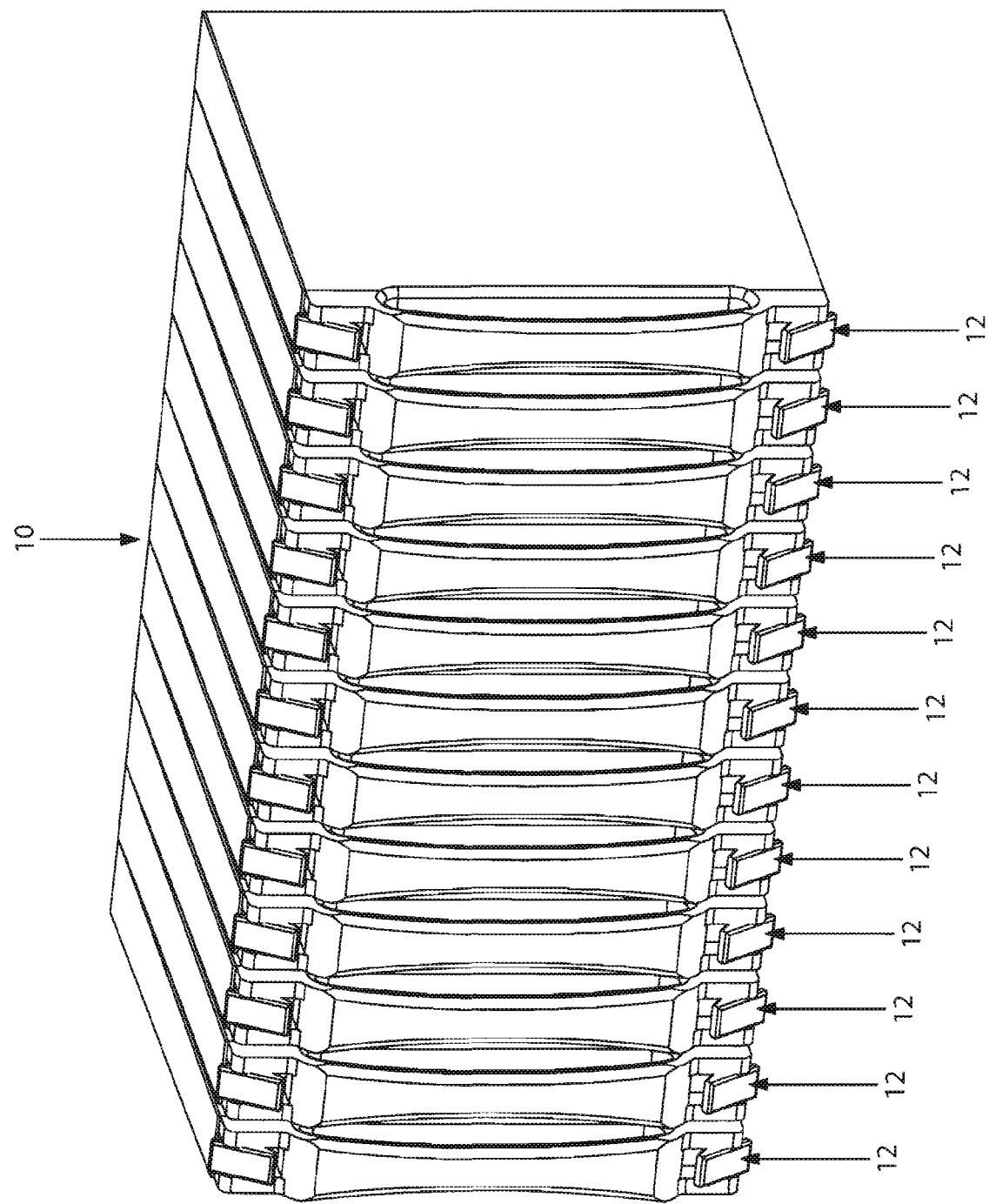
FIG. 1 shows an array of cases integrated with an electronic system and a cooling system.

A liquid submersion-cooled system is described that is suitable for cooling a number of array-based electronic devices, including cooling heat-generating components in computer server systems and other systems that use electronic, heat-generating components. In the case of computer server systems, the liquid submersion-cooled system permits creation of, for example, arrays of computers with scalable architectures where it is possible to produce 32 to 64, or more, processor core logic boards (8 sockets×8 cores=64 processor). These logic boards in a case system, forming an array, can be interconnected to form one or more massively-parallel super computers.

Examples of electronic devices to which the concepts described herein can be applied include, but are not limited to: servers including blade servers; disk arrays/storage systems; storage area networks; network attached storage; storage communication systems; work stations; routers; telecommunication infrastructure/switches; wired, optical and wireless communication devices; cell processor devices; printers; power supplies; displays; optical devices; instrumentation systems including hand-held systems; military electronics; etc. Many of the concepts will be described and illustrated herein as applied to an array of computer servers. However, it is to be realized that the concepts described herein could be used on other electronic devices as well.

FIGS. 1, 2, 3, 4, and 5 illustrate one embodiment of an array-based server computer system 10 employing a liquid submersion cooling system. The system 10 includes a plurality of separate cases 12 each containing a self-contained computer system, for example, a computer logic board, daughter cards, power supplies and other active electronic computer components, and a cooling system.

All electronic and thermally active components of each case 12 are submerged in dielectric cooling liquid where the dielectric cooling liquid is in direct contact with the electronically and thermally active components. Thus, each case forms a tank containing the cooling liquid and the computer system. Dielectric liquids that can be used in this type of immersive cooling system include, but are not limited to:

Engineered fluids like 3M™ Novec™
Mineral oil
Silicone oil
Natural ester-based oils, including soybean-based oils
Synthetic ester-based oils Many of these dielectric fluids also have the ability to extinguish fires on computer components. By submerging computer components in a dielectric, fire-retardant fluid, the chance of a fire starting due to computer component failure is minimized. Other dielectric liquids that have a higher boiling temperature along with greater thermal transfer capability can be employed. These cooling liquids need not change state if they have a high enough thermal transfer capability to handle the amount of heat being generated by components contained in the system.

Figure 2:
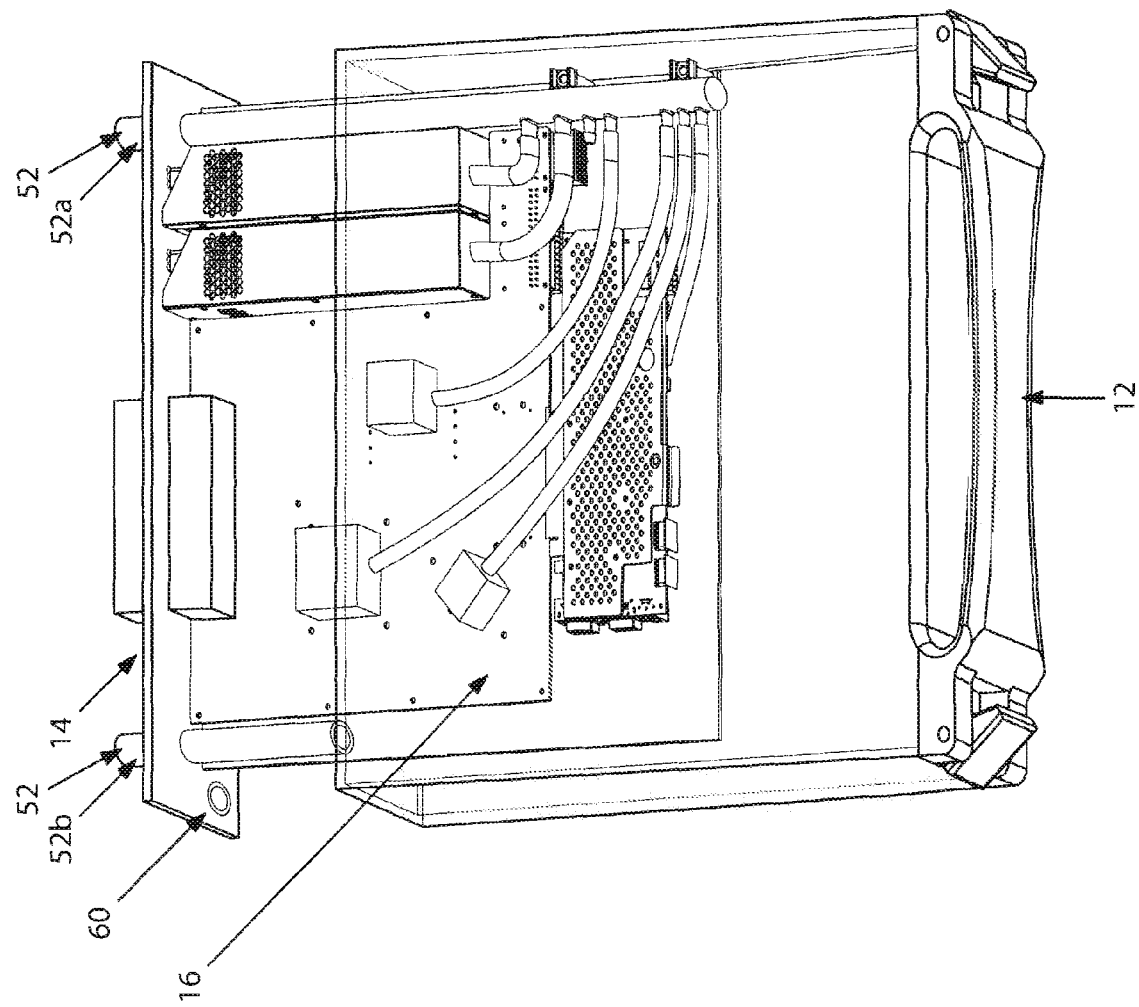
FIG. 2 shows an individual case with the removable lid in an open position.
Figure 4:
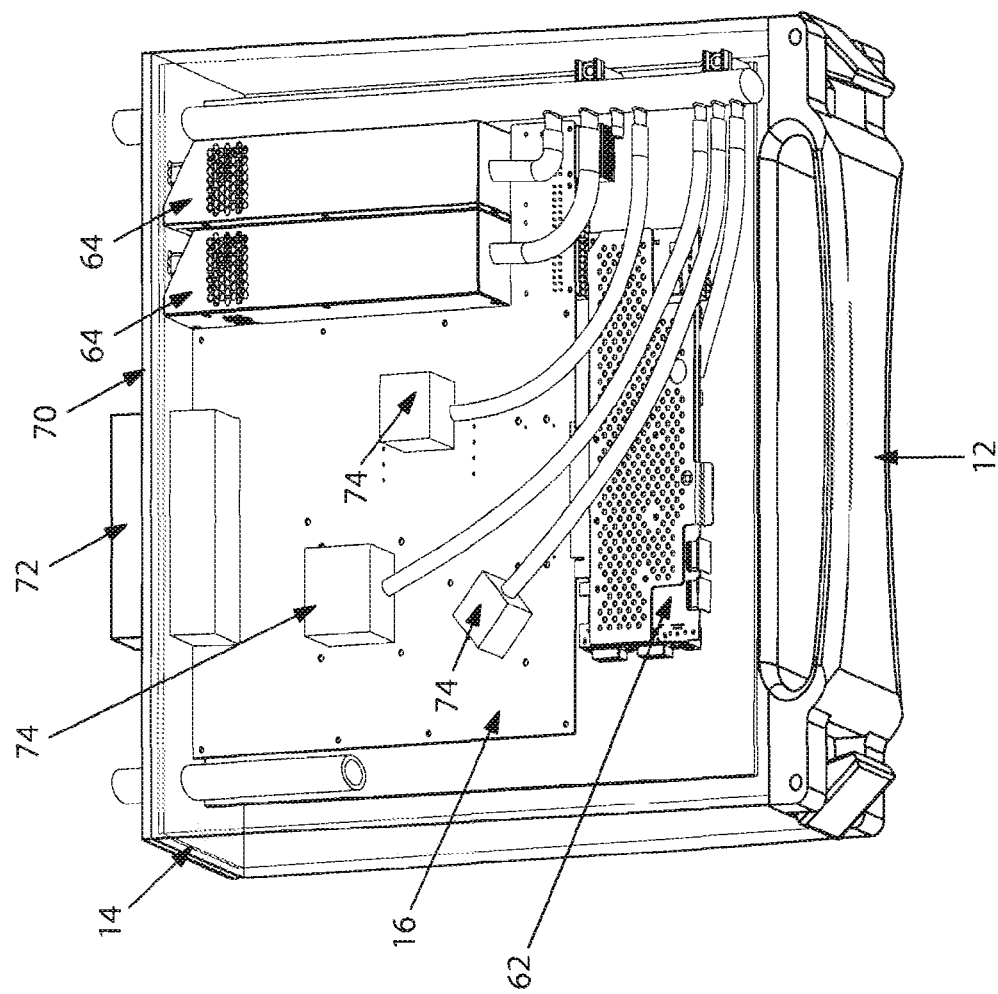
FIG. 4 shows the case with the logic board, video/daughter board, power supply unit, top plane board and an external input/output connector that engages with the rack input/output bus.

With reference to FIGS. 2 and 4, each case 12 includes a lid 14 that attaches to the connector side of a computer logic 16, allowing logic board input/output (IO) connections, daughter card IO and power to be passed in and out of the case 12. Components such as daughter cards, additional processors, power supply card, and memory cards, which mount onto the logic board 16, can be added to or removed from the case 12 by opening the case lid 14 and lifting the attached logic board and electronics out of the case. The edges of the logic board 16 can be slideably disposed inside grooves formed on opposite inside walls of the case 12 to facilitate insertion and removal of the logic board from the case. In addition, a mechanical hard drive can be disposed in the case 12, with an air line connected to the hard drive breather hole leading from the hard drive to the exterior of the case.

Figure 5:
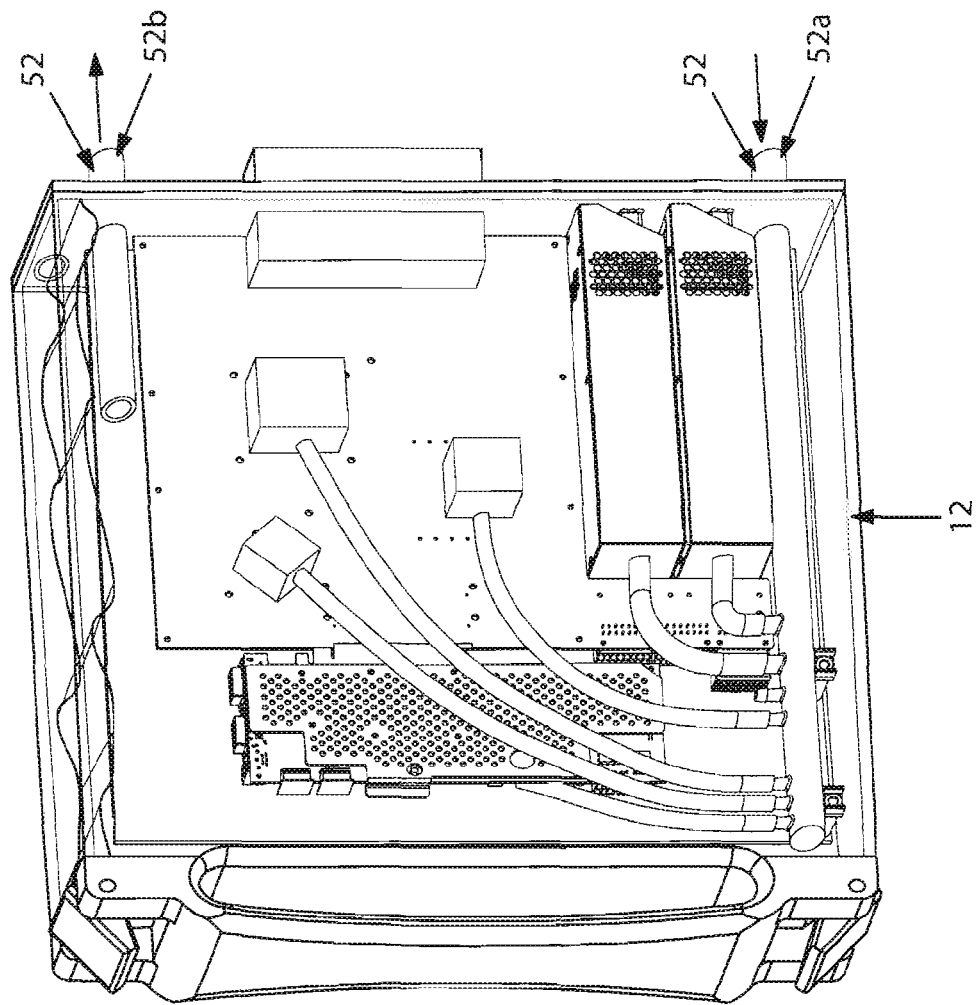
FIG. 5 shows a case filled with dielectric fluid and quick-disconnect valves that engage the rack manifold quick-disconnect valves.

In the illustrated example in FIGS. 2, 4, and 5, the rear of the case 12 (when the case is oriented during use) is closed by the lid 14. To access the interior of the case 12, the case is oriented handle end down so that the lid 14 is disposed at the top. The lid 14 can then be removed to lift the attached logic board 16 out of the case. Other orientations of the lid 14 are possible. For example, the lid could close the top of the case 12 (when the case is oriented during use) or close any other side of the case.

In one embodiment, an internal or external pumping system can be used to pump warm liquid from the top of the cases and pass it through external heat exchangers, heat pumps, or other thermal dissipation/recovery devices. In other embodiments, the flow can be convective, or result from gravity, avoiding the need for a pump(s). The flow of liquid can also be caused by various combinations of pumps, convection, and gravity.

Figure 6:
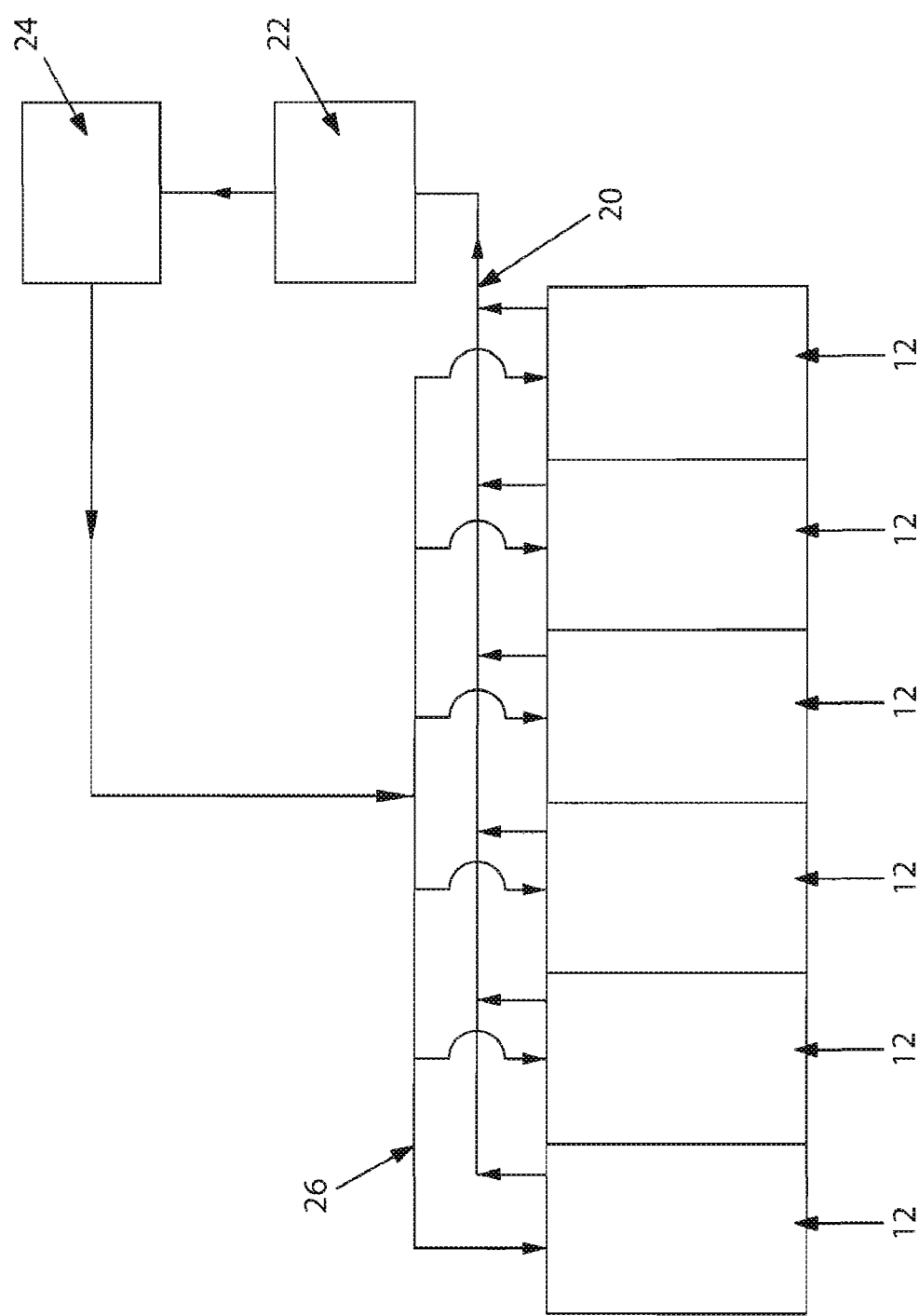
FIG. 6 shows a cooling system including the array of cases, an external pump and a thermal dissipation/recovery device.

An exemplary embodiment is illustrated in FIG. 6 which shows the cases 12 arranged in an array, with the cases connected to an outlet manifold 20, an external pump 22 that pumps liquid from the cases 12 to a thermal dissipation or recovery device 24, with the cooled liquid then being directed to an inlet manifold 26 for directing the cooled liquid back into the cases.

If desired, more than one thermal dissipation/recovery device can be utilized, and a combination of thermal dissipation and thermal recovery can be used. In addition, a pump can be disposed inside each case 12 if desired.

Figure 15:
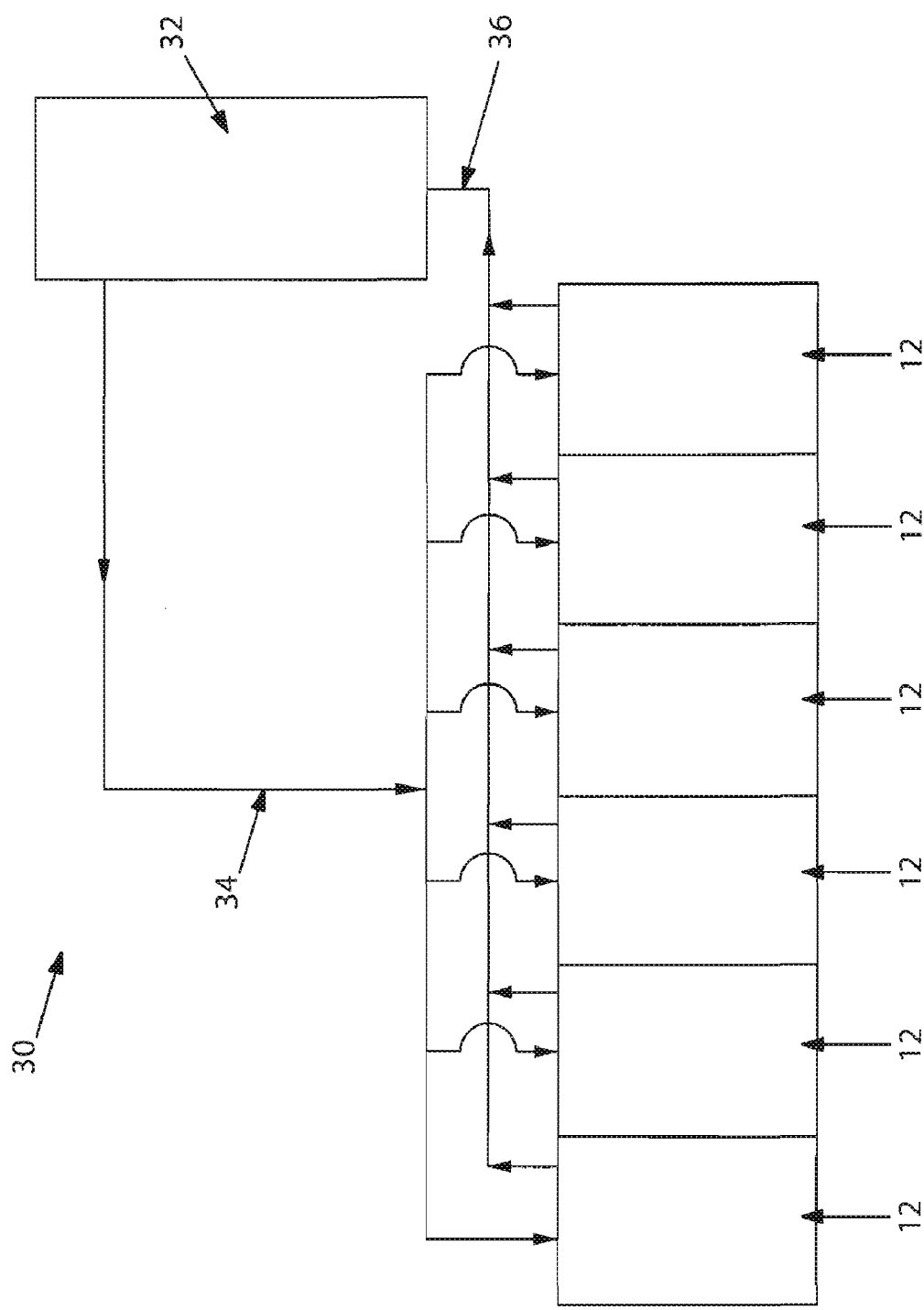
FIG. 15 illustrates an exemplary coolant distribution system that can be used with the array of cases.

FIG. 15 illustrates another example of a coolant distribution system 30 connected to the array of cases 12 for distributing coolant liquid to the cases and receiving coolant from the cases 12. The illustrated system 30 includes a thermal dissipation or recovery device 32, a coolant supply line 34, and a coolant return line 36. The coolant would be pumped by a suitable pump that is part of the thermal dissipation or recovery device 32 or by an external pump similar to the system in FIG. 6. The system 30 could be, for example, a two-pipe reverse return system where the first case 12 that is supplied with coolant liquid is the last to return coolant, so that the flow path of coolant liquid to and from each case is the same length. An advantage of a two-pipe reverse-return system is that it equalizes the pressure drop across the cases.

The thermal dissipation or recovery device can be any device that is suitable for dissipating heat or allowing recovery of the heat from the heat liquid. For example, the device can be a simple heat exchanger, such as a radiator, for dissipating heat. Air or liquid could be used as the heat exchanging medium. In addition, the heat exchanger could be disposed underground to allow the relatively cool ground to cool the liquid. The external heat exchanger can take on a number of different configurations, as long as it is able to cool the liquid down to an acceptable temperature prior to being fed back into the space. Examples of thermal dissipation devices include, but are not limited to, a cooling stack, evaporation, and an in-ground loop.

Cooling of liquids utilizing a heat exchanger can be accomplished by one of several means:
- A compressor, as is the case with typical refrigeration systems
- Peltier effect cooling
- Active air cooling of the radiator surface using a fan or other air-moving mechanism
- Passive cooling by exposing as large of a thermally conductive heat exchange surface as possible to lower ambient temperatures The thermal dissipation or recovery device could also be a heat recovery device where recovered heat is used for environmental heating. For example, the heat recovery device can be part of a building or room heating system where recovered heat is used to heat the building. Examples of thermal recovery devices include, but are not limited to, in-floor heaters and geothermal electricity generation.

In one embodiment, the cases are contained in a room while the pump and the thermal dissipation or recovery device are located outside the room. Because liquid is used for cooling and the heated liquid is pumped outside the room, heating of the room by the electronics in the cases is minimized. This reduces the amount of air conditioning that is required inside the room, which reduces electrical use and the cost of maintaining the array of cases in the room.

Figure 16:
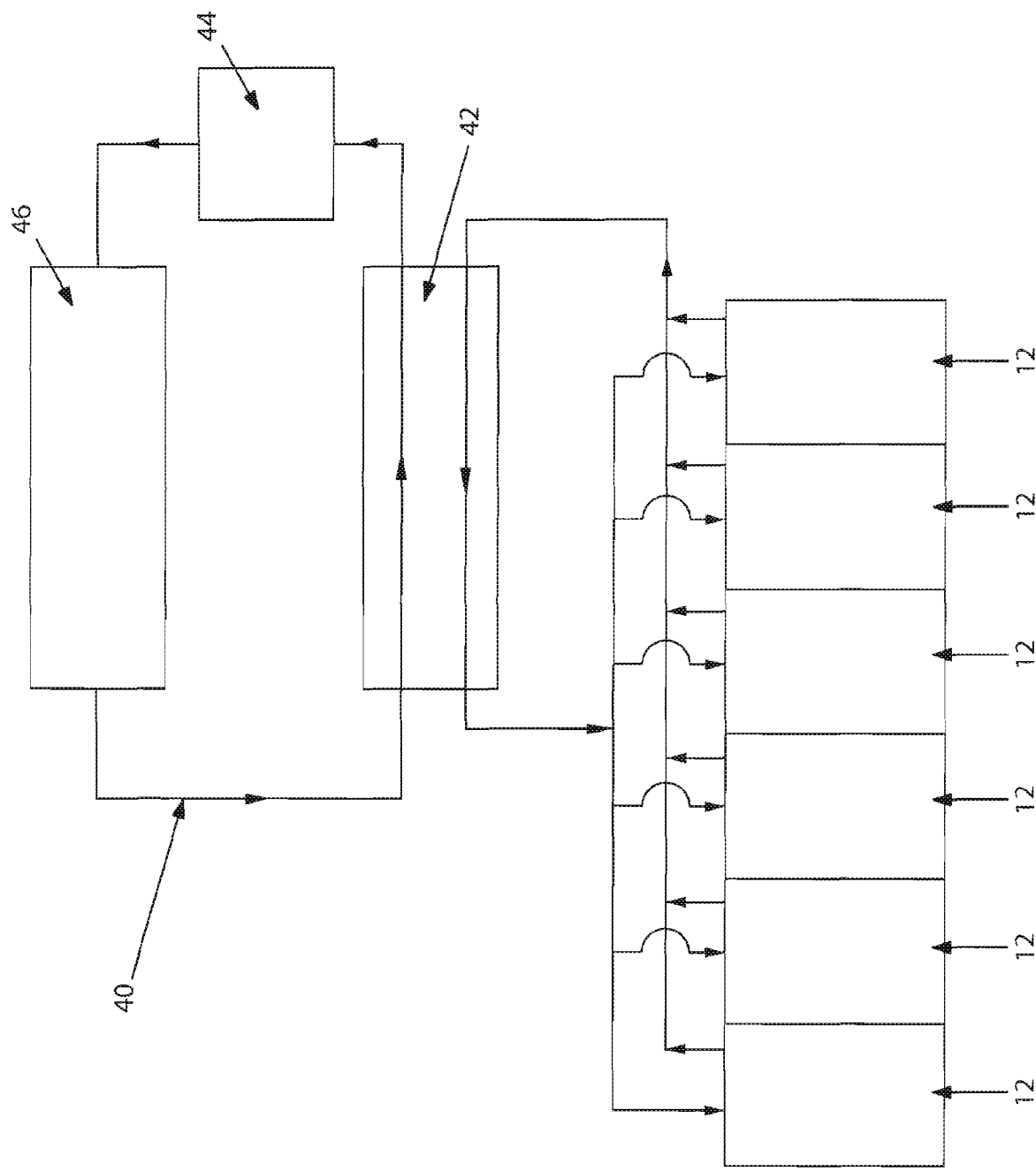
FIG. 16 illustrates the use of a fluid cooling loop to cool the dielectric cooling liquid.

The dielectric cooling liquid need not be the only liquid used in the thermal dissipation or recovery system. In the embodiment illustrated in FIG. 16, a water cooling loop 40 is used to cool the dielectric coolant of the cases 12. The dielectric coolant circulates in a loop through a heat exchanger 42. The water cooling loop 40 also runs through the heat exchanger 42 where it exchanges heat with and cools the dielectric coolant. The water in the loop 40, which can circulate via a pump 44, convection, and/or by gravity, is then directed to a thermal dissipation or recovery device 46.

Figure 3:
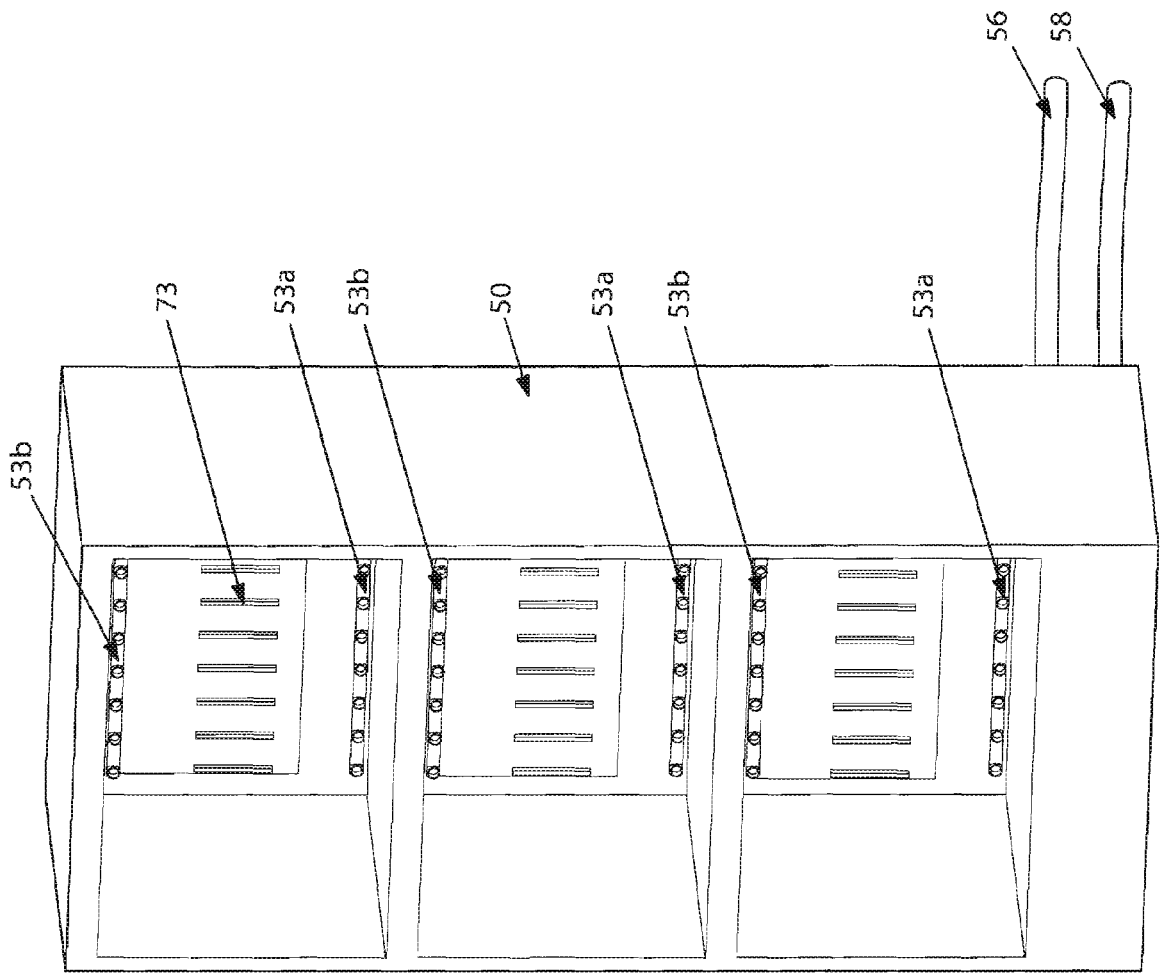
FIG. 3 shows the rack system that holds the array of cases.

The cases 12 will be connected in an array using a rack system 50 as shown in FIG. 3 and will connect to inlet and outlet manifolds via quick disconnect valves 52 disposed at the rear of the cases 12 as shown in FIGS. 2 and 5. One valve 52 will act as an inlet 52a for coolant into the case, while the other valve 52 will act as an outlet 52b for coolant from the case, with the valves preventing flow of liquid through the inlet 52a and outlet 52b unless the valves are opened. The valves 52 will engage inlet 53a and outlet 53b manifolds disposed at the rear of the rack system 50, shown in FIG. 3. The flow lines of the inlet and outlet manifolds 53a, 53b leading to the cases 12 will also utilize quick-disconnect valves that engage with the valves 52, for example so that the valves 52 on the case and the valves on the manifolds 53a, 53b will automatically open upon installation of a case, and automatically close upon removal of the case. The quick-disconnect valves would allow the change-out of a failed server computer using a hot swappable system architecture.

The rack system 50 includes a frame 54, a coolant return line 56 connected to the inlet manifolds 53a at the rear of the frame 54, and a coolant outlet line 58 connected to the outlet manifolds 53b. The cases 12 are each mountable on the frame 54 to support the cases in the desired array configuration. The frame 54 illustrated in FIG. 3 is illustrated as being capable of supporting three vertically-spaced rows of cases that are slid into the frame 54. Each case 12 can be provided with means to facilitate sliding insertion and removal of the case. For example, a bearing mechanism can be provided on the base of each case that makes it easier for the cases to slide into and out of the frame 54.

FIGS. 2 and 4 show a number of active computer components mounted on the logic board that require cooling, including a video/daughter board 62, power supplies 64, and processors (disposed under the dispersion plenums 74). In some embodiments, a pump can also be mounted on the logic board 16 or on the interior of the lid 14. A top plane board 70 is connected to the underside of the lid 14, and an external input/output connector 72 is disposed at the rear of the lid 14. The external I/O connector 72 engages with an input/output bus 73 on the rack system 50 shown in FIG. 3. Each case 12 is large enough to contain all of the active computer components that require cooling. It may also be necessary to leave space for liquid return lines and/or dispersion plenums 74 that are used to direct cooling liquid over specific, high-temperature areas, for example the CPUs, as discussed below with respect to FIG. 7.

As shown in FIGS. 2 and 4, the lid 14 not only provides a liquid- and gas-tight seal for the case 12, but it also contains the pass-through connector 72 that allows external component IO, storage IO and power to pass into and out of the case 12 to and from the computer logic board 16 and its components. The lid 14 has a gasket that will seal the case. The lid 14 may also contain a fill port for filling the case with coolant.

With reference to FIG. 4, the server logic board 16 is essentially functionally the same as in current server specification boards, with the exception being that it does not have the same IO and power connectors. Instead, the top edge of the logic board 16 can be provided with, for example, a series of conductive pads that are contacts for engaging the pass-through connector 72. Alternatively, a liquid-tight bus-type pass-through connector may be employed to pass IO and power through the case 12.

Figure 17:
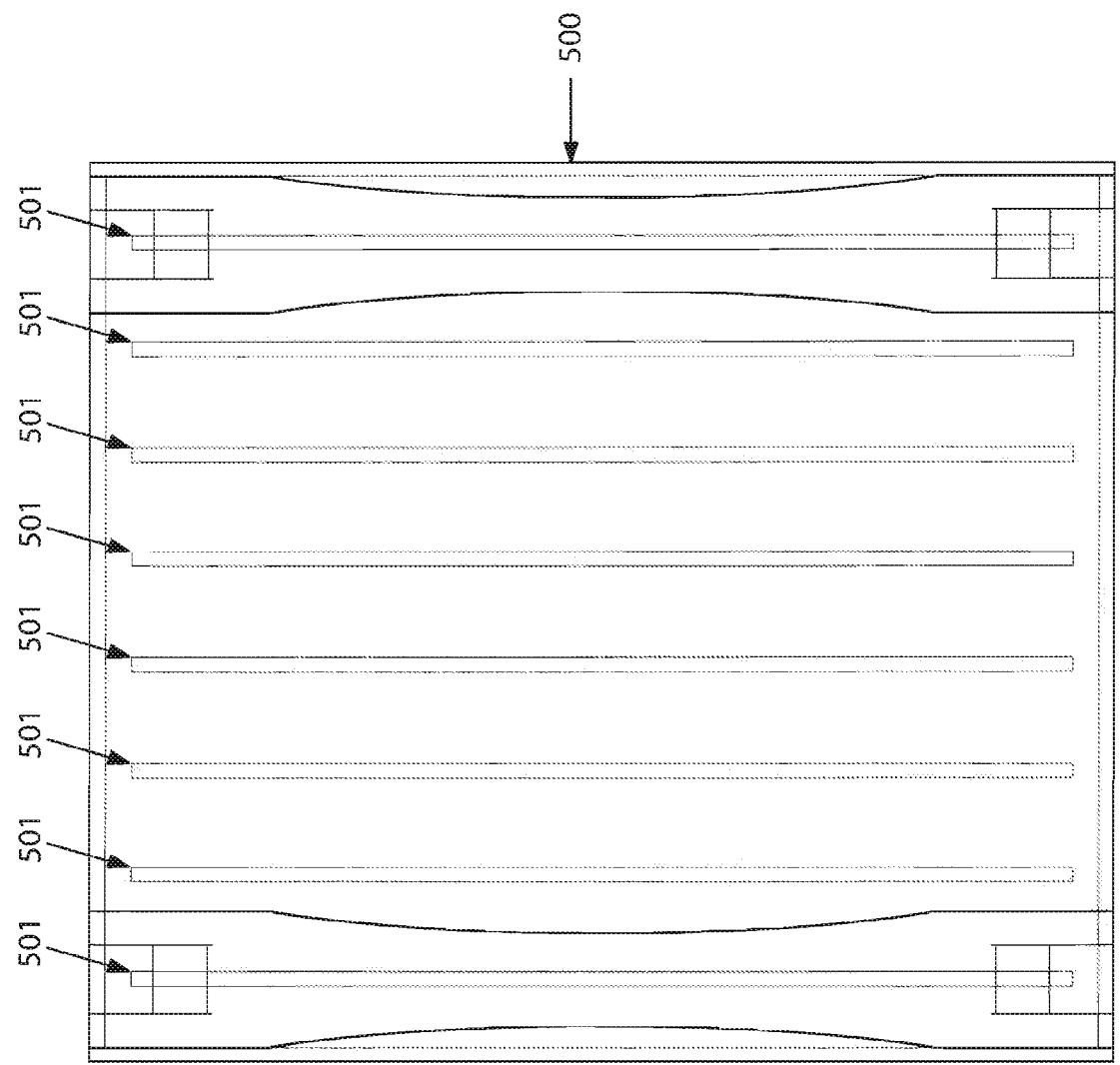
FIG. 17 is a front view of another embodiment of a case in which a plurality of logic boards are contained.

Multiple logic boards or other circuit boards may be employed to allow stacking of extra processors or other components for additional computing power or to allow for multiple computers within a single case. For example, FIG. 17 illustrates a case 500 that is constructed similar to the case 12, but containing a plurality of logic boards 501.

The described cooling system would allow for numerous server computer systems to be cooled in a single case (FIG. 17) or individual cases which may be interconnected to create a server or workstation rack system (FIGS. 1-6).

With reference to FIG. 4, the daughter card(s) 62 connect to the logic board 16 as they do with current server specification boards. Daughter cards can include video cards and other PCI or PCIE cards that require IO pass-through to the outside of the case. These daughter cards will require liquid- and gas-tight gaskets in order to allow external IO connections.

Unlike current server designs, the power supplies 64 may also be daughter cards, with no power supply to logic board wiring required. The power supplies may also be directly integrated into the logic board 16. External alternating current (AC) or direct current (DC) connections would be made through the pass-through connector 72 into the liquid-filled case with a liquid and gas-tight gasket.

The pumping system, if used, is preferably externally mounted, supporting all of the cases 12 in the array. The pumping system is used to circulate warm liquid from inside the cases 12 to outside of the cases to the thermal dissipation/recovery device(s). Liquid may also be circulated through external hard drive cooling plates as well. The pumping system can be wired such that it can be turned on to circulate liquid even if the server computers are turned off. Or the pumping system can be wired to turn on only when the server computers are on. After the server computers are shut off, there is more than sufficient thermal capacity in the liquid within the cases 12 to remove residual heat from the submerged components. This would ensure that there is no post-shut down thermal damage. Also, if a flow sensor or pump monitor indicates that flow of coolant has stopped or has slowed below a minimum required rate, a controlled shut-down of the server computers could be completed well before any damage is done to the submerged components. This embodiment avoids the possibility of a pump system failure, resulting in catastrophic failure of a server computer that relies on air cooling.

Hard drives or other internal storage systems can also be submerged. In the case of current platter-based, mechanical storage systems that require breather holes, the air line could be fixed over the breather hole, allowing an open-air connection to the outside of the case. The rest of the drive would be sealed as to be gas and liquid impermeable.

The processors mount to the logic board 16 via normal, vender-specified sockets. Testing has shown that, in some instances, no heat sinks or other appliances need to be attached to the processors in order to cool them sufficiently for normal, vendor-specified temperatures. However, if lower operating temperatures or a higher level of heat transfer is required for higher-powered processors or processor over-clocking, heat sinks, which greatly increase the exposed surface area of heat conduction from the processor(s), may be employed.

When a case 12 is removed from the array rack 50, electrical power (AC or DC) becomes disengaged from the external connector 72 of the case 12, opening the electrical circuit and disconnecting electrical power (AC or DC) from the interior space of the case 12.

The lid 14 can also include an opening through which cooling liquid can be added into the space. The opening is closed by a removable cap which is removed when liquid is to be added. The lid can also include a lock mechanism that locks the lid in place and locks the case into the rack system 50 as shown in FIG. 3.

As described above, the server logic board assembly is removable and disposed in the interior space to permit the server logic board assembly to be lifted from the space when the lid is lifted upward.

The interior space of each case 12 should contain enough dielectric cooling liquid to submerge the components that one wishes to be submerged. For example, the cooling liquid may substantially fill the interior space, whereby all heat-generating components on the logic board 16 are submerged. The cooling system is designed to direct heated dielectric liquid from inside the space and through the external quick-disconnect valves 52 to the heat exchanger(s), heat pump(s), or other thermal disposition/recovery devices where the liquid is cooled. The cooled liquid is then returned to each case through the rack system 50 and the inlet 52*a* and outlet 52*b*.

Figure 7:
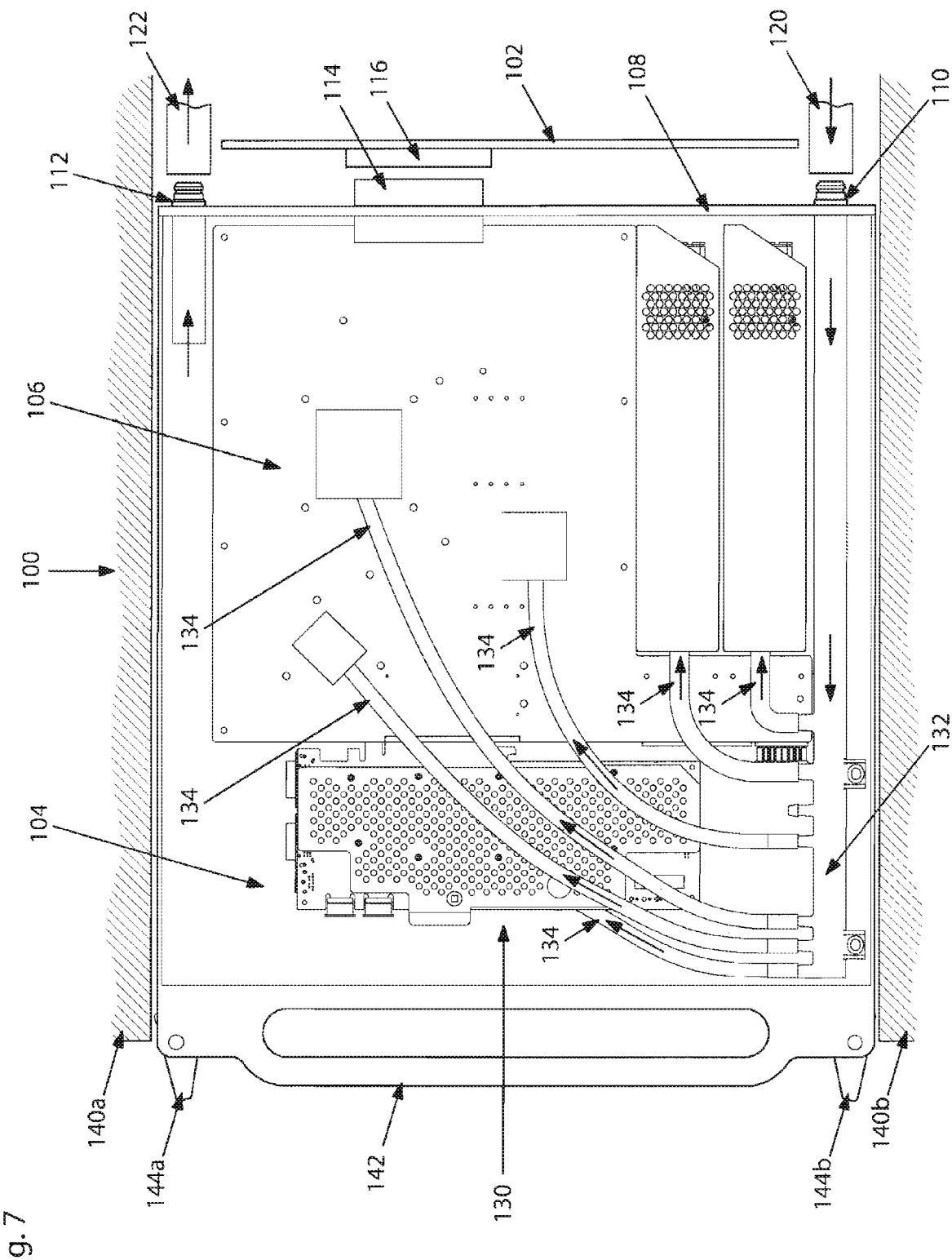
FIG. 7 is a side view of an alternative embodiment of a case that is useable in an array.

FIG. 7 illustrates a case 100 that is useable in an array. The case 100 is designed to electrically connect to a backplane IO board 102. The case 100 includes a liquid-tight housing 104 inside of which is a circuit board 106, for example a logic board, mounting various heat generating electrical components that are submerged in cooling liquid. A lid 108 closes the rear of the housing 104. The lid 108 can be removable to allow access to the interior of the housing, or the lid can be non-removable to permanently close the housing.

A liquid inlet 110 is formed on the back side of the housing near the base thereof and a liquid outlet 112 extends from the back side adjacent the top. This arrangement of the inlet and outlet introduces the cooled liquid near the bottom, and since the liquid will rise as it is heated, the heated liquid can exit the outlet 112. The inlet 110 and outlet 112 are provided with quick-connect valves, where the valves are designed to automatically open upon connection with a manifold inlet 120 and a manifold outlet 122, respectively, that extend through the backplane board 102. The inlet 120 and outlet 122 are also provided with quick connect valves that automatically open upon connection, with the inlet 120 leading from an inlet manifold (see FIG. 6) and the outlet 122 connecting to an outlet manifold (FIG. 6).

An IO connector 114 extends from the back side of the housing, with the connector 114 extending through the back wall of the housing and being connected to the circuit board 106. The IO connector 114 is designed to electrically connect with a connector 116 of the backplane IO board 102 to direct inputs and outputs to and from the circuit board, and if necessary to pass electrical power into the housing. A similar connector 116 is provided to connect to the connector 114 of each case 100 of the array.

In areas where there is significant heat, directed liquid flow can be used to provide localized cooling. In particular, as shown in FIG. 7, a directed liquid cooling assembly 130 is connected to the inlet port. The assembly 130 includes a manifold 132 in communication with the inlet 110, and a plurality of tubes 134 that extend from the manifold to direct liquid to specific targeted hot spots, such as CPUs, on the circuit board 106. The ends of the tubes 134 are positioned adjacent the desired hot spots, or the tubes 134 can connect to dispersion plenums 136, similar to the dispersion plenums 74, to help direct the flow of the return liquid to the targeted hot spots.

Figure 19B:
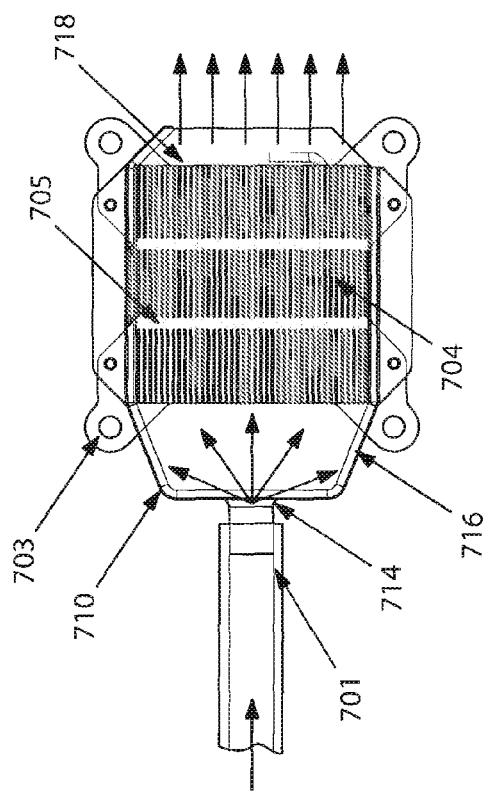
FIGS. 19A, 19B and 19C are an isometric view, a top view with the top wall removed, and a side view, respectively, of a directed flow heat sink and dispersion plenum assembly for cooling a targeted hot spot on a logic board.
Figure 19C:
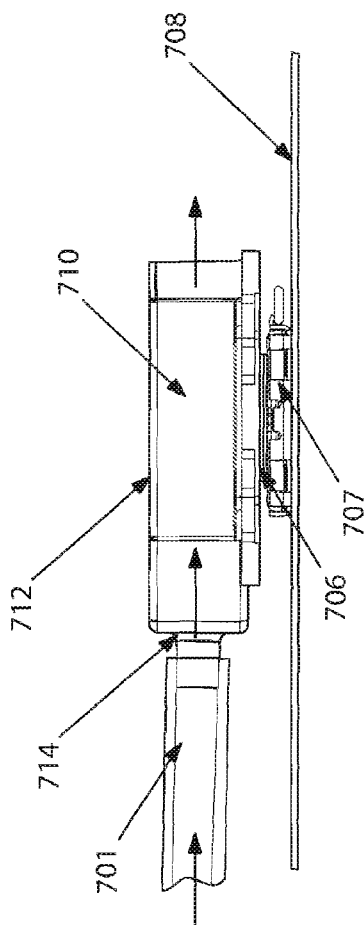
Figure 19A:
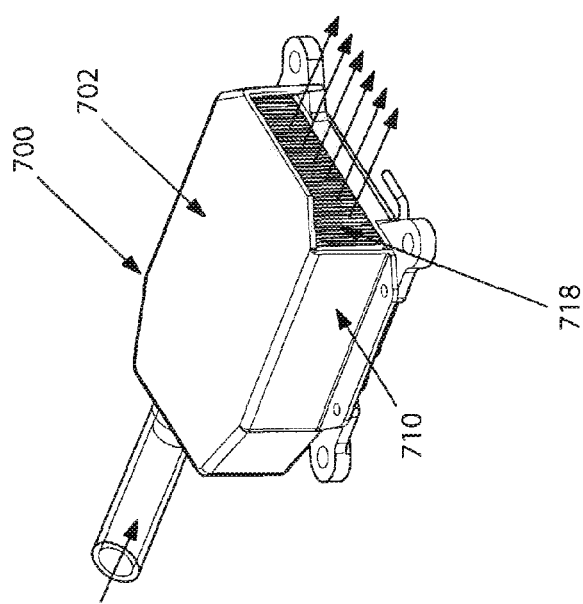

FIGS. 19A-C illustrate details of one example of a directed flow heat sink and dispersion plenum assembly 700. The assembly 700 includes a dispersion plenum housing 702 that is a structure made of a suitable material, for example plastic or metal, having perimeter side walls 710, and a top wall 712. An inlet tube 701, similar to the tube 134, connects to an inlet port 714 provided on one of the perimeter side walls 710 for directing coolant into the interior of the housing 702. Although a single inlet port 714 is illustrated, a plurality of inlet ports can be provided, each connected to an inlet tube 701. The number of inlet ports and the tubes connected to the inlet ports can vary depending upon the cooling needs of the targeted hot spot.

The housing 702 closely envelopes a specific targeted hot spot, such as a GPU or a CPU 706, that has a heat sink 703 mounted thereto. The CPU 706 is mounted on a socket 707 on the circuit board 708. The heat sink 703 can comprise, for example, a plurality of fins 704 that extend upwardly from engagement with the CPU 706 toward the top wall 712. The fins 704 include substantial surface area to optimize heat exchange with the CPU. The heat sink fins may be machined, skived, cast or otherwise formed to create a large surface area for heat removal from the CPU through direct contact with the cooling liquid. In the illustrated example, the fins 704 are oriented generally parallel to the coolant flow direction shown by the arrows. To help mix or break up the flow, gaps 705 can be provided between the fins 704.

An opening 718 is formed in one side of the housing 702 to allow coolant to flow out of the interior space. The opening 718 can be provided at any location that allows escape of the coolant from the interior of the housing 702 as the coolant is heated through heat exchange with the fins and the CPU. The heated coolant may rise upwardly toward the top of the case after leaving the housing 702 or be expelled in any direction that the opening 718 is facing due to pressure created by the pump supplying the plenum assembly. In the illustrated embodiment, the opening is formed by a gap formed in the perimeter side wall 710 opposite the inlet port 714. More than one opening can be provided, and the opening can be provided at any suitable location on the housing 702 to allow the heated coolant to escape the housing 702 and rise upward toward the top of the case or be ejected in the forced flow direction.

In addition, the housing 702 defines an expansion chamber 716 near the inlet port 714 that allows the coolant entering the housing to flow in multiple directions so as to flow over the entire expanse of the fins 704.

In use, directed flow through the tube 701 from the manifold, or flow directly from a pumped source, is contained within the confined space defined by the plenum housing 702. This confined space closely envelopes the CPU and the heat sink fins 704 connected to the CPU. The plenum housing 702 contains the liquid flow, forcing the liquid to have mixed flow or, under certain conditions turbulent flow, throughout the entirety of the heat sink surface. This helps to optimize heat exchange in order to more efficiently cool hot components, such as CPUs, GPUs, north bridge, south bridge and/or other components that create a substantial amount of heat relative to the rest of the electronics system in which they are utilized. After contacting the CPU and fins, the liquid exits the plenum housing 702 through the opening 718.

The plenum housing 702 need not form a liquid-sealed enclosure over the CPU and fins, and in the illustrated example does not form a liquid-sealed enclosure. This helps eliminate the need for tight manufacturing tolerances. The plenum housing 702 should be configured to help contain the liquid as it flows over the CPU and fins. The amount or degree of flow containment can vary depending upon how much flow containment, and resulting increase in cooling effectiveness, one wishes to achieve.

The case 100 is designed to slide into a space between upper and lower shelves 140*a*, 140*b* of the rack. Other cases of similar design would be disposed between the shelves 140*a*, 140*b* next to the case 100. To facilitate insertion and removal of the case 100, a handle 142 can be formed on the housing 104. In addition, hinged locks 144*a*, 144*b* can be provided on the case 100 and/or on the shelves 140, 140*b* to hold the case 100 in place in the rack.

Figure 8:
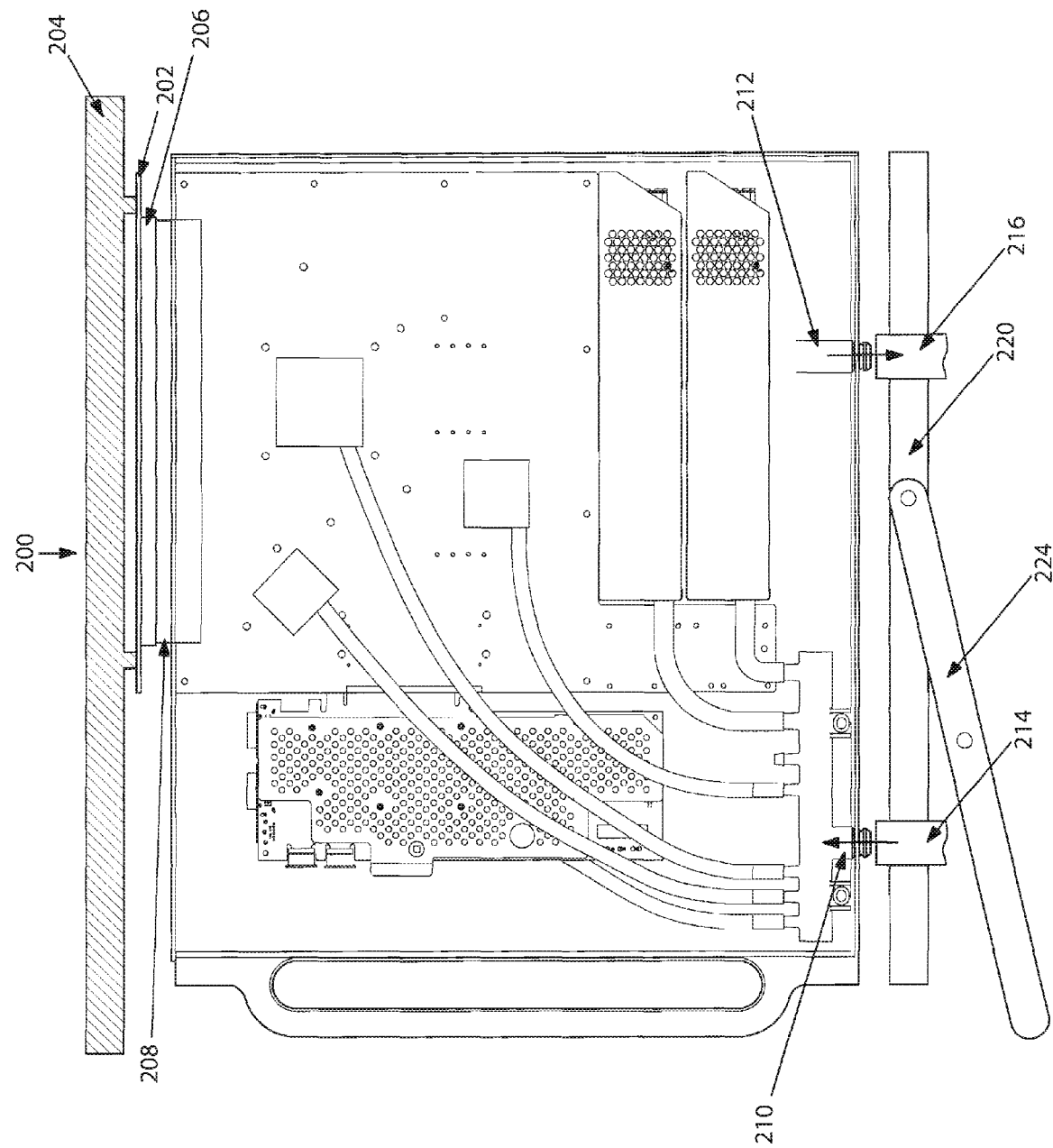
FIG. 8 is a side view of yet another embodiment of a case.

FIG. 8 illustrates a case 200 that is designed to achieve electrical and liquid connection via a vertical upward movement of the case. The case 200 is generally similar to the case 100 in FIG. 7, including a liquid-tight housing inside of which is a circuit board mounting various heat generating electrical components that are submerged in cooling liquid. The case 200 is designed to connect with a top plane 202 mounted on an upper shelf 204. The top plane 202 has an IO connector 206 that connects with an IO connector 208 that extends from the top of the case housing, with the connector 208 extending through the top of the housing and being connected to the circuit board inside the housing.

In addition, a liquid inlet 210 and a liquid outlet 212 are formed on the bottom of the housing. The inlet 210 and outlet 212 are provided with quick-connect valves, where the valves are designed to automatically open upon connection with a manifold inlet 214 and a manifold outlet 216, respectively, that extend from and through a vertically movable base 220. The inlet 214 and outlet 216 are also provided with quick-connect valves that automatically open upon connection.

A lever system is engaged with the base 220 for actuating the base vertically. The lever system includes a lever 224 that is pivotally connected adjacent the base 220 and engaged therewith such that when the lever 224 is pivoted it actuates the base upwardly. When the base moves upward, fluid engagement between the inlet and outlet 210, 212 and the manifold inlet and outlet 214, 216 is achieved, and electrical connection between the IO connectors 206, 208 is achieved.

Figure 9:
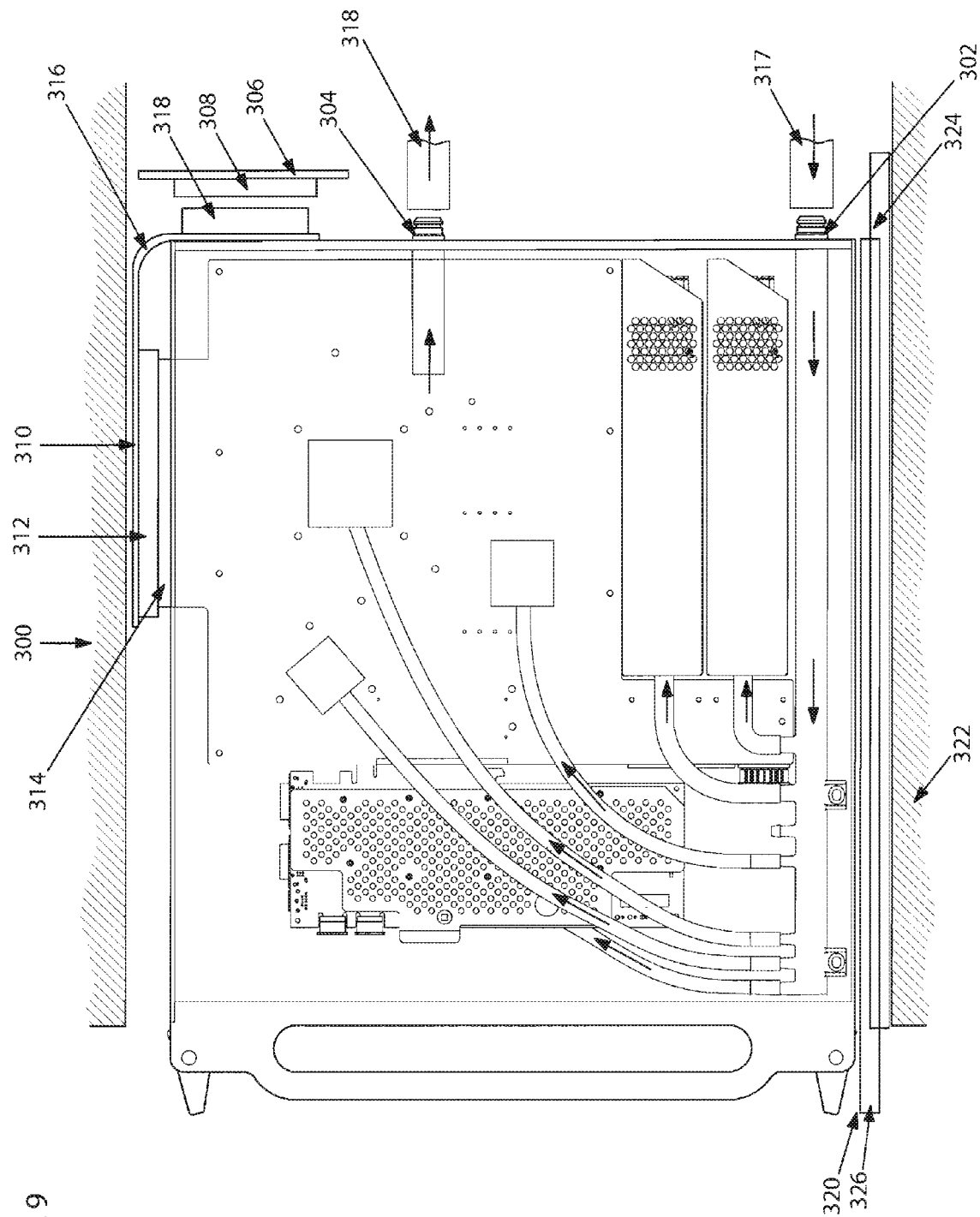
FIG. 9 is a side view of still another embodiment of a case.

FIG. 9 illustrates a case 300 that is similar to the case 100 in FIG. 7, including liquid inlets 302 and outlets 304 on the back side of the case housing that connect to liquid inlet 317 and outlet 318 lines, respectively. A backplane IO board 306 includes an IO connector 308. A top plane 310 is connected to the top of the case 300 having an IO connector 312 connected to an IO connector 314 extending through the top of the case housing and engaged with the circuit board in the case housing. The top plane 310 includes an attached flex portion 316 containing an IO connector 318 that is designed to connect to the IO connector 308.

The case 300 can also be mounted on a telescoping bearing slide 320 which allows the case to slide in and out of position. The slide 320 is fixed to the lower shelf 322 and includes a first slide portion 324 and a second slide portion 326 slideable relative to the first slide portion 324.

Figure 10:
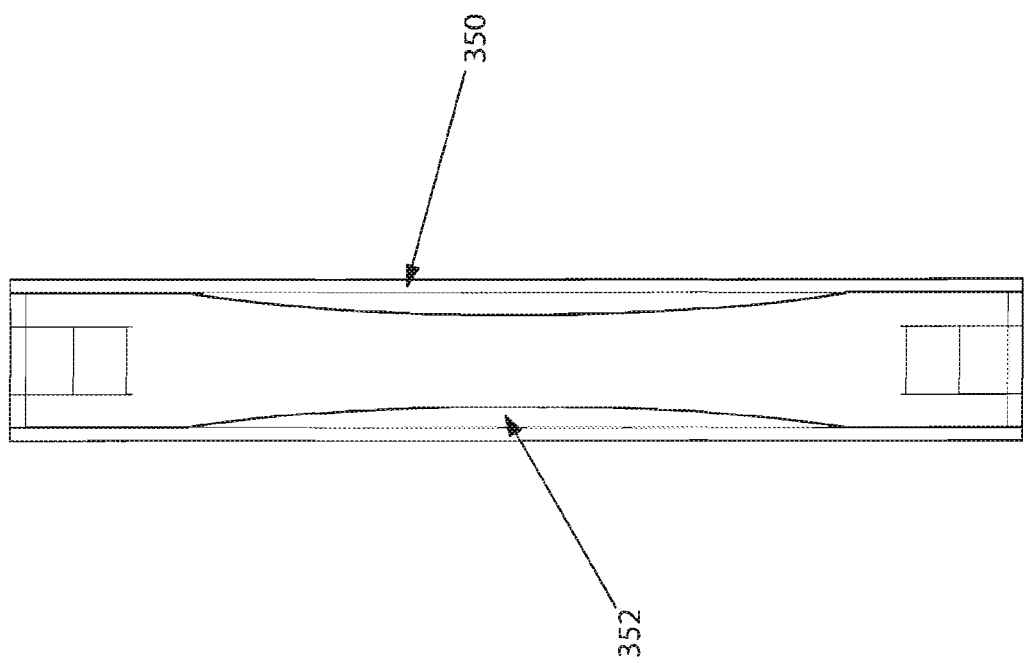
FIG. 10 is a front view of a case with an ergonomic handle.

FIG. 10 illustrates the front of a possible case design where the case housing 350 has side walls that slope outwardly from front to back so that the housing is wider at the back than at the front. In addition, the front of the housing from top to bottom is curved in a crescent shape to form a generally hour-glass shaped handle 352 which can be gripped to facilitate insertion and removal of the case from the rack.

Figure 11:
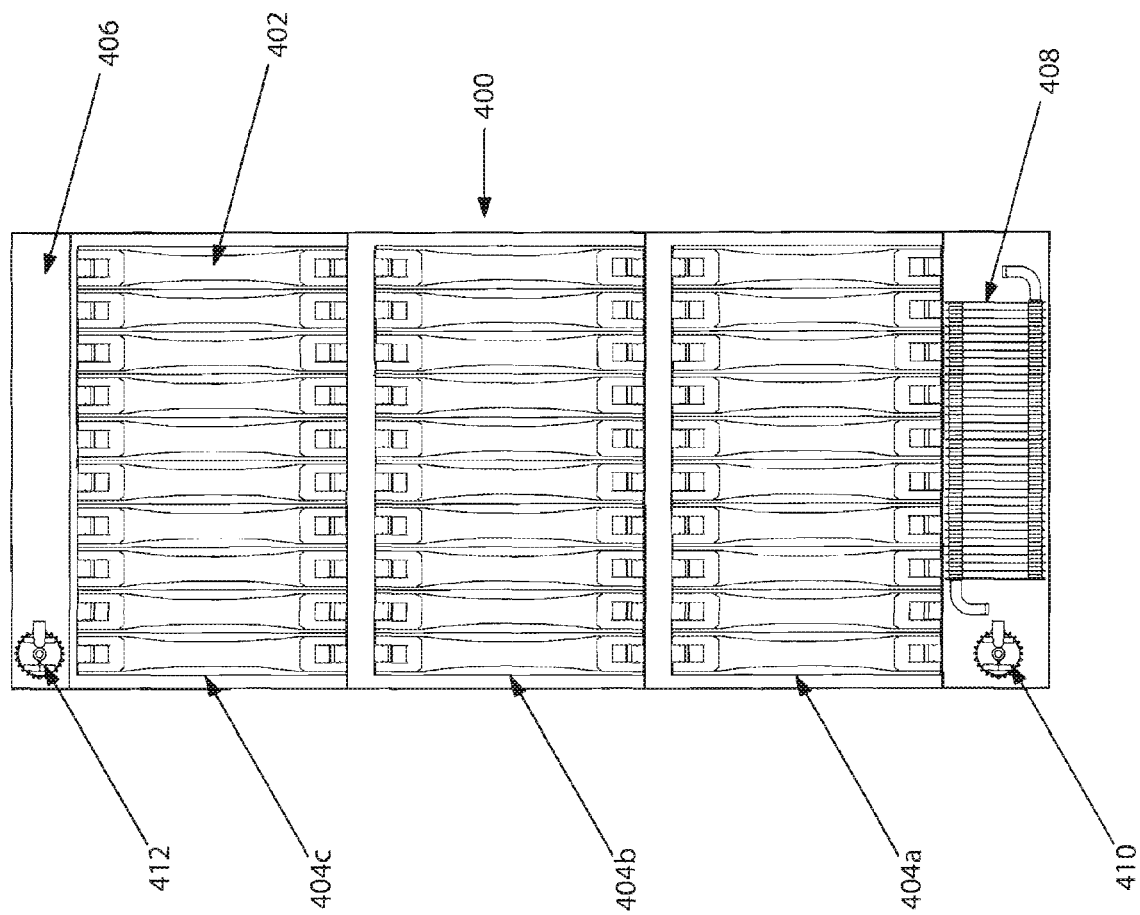
FIG. 11 is a front view of a vertically stacked array of cases.

FIG. 11 illustrates an array 400 of cases 402 stacked in vertical levels 404*a*, 404*b*, 404*c*. Each level 404*a-c* includes a plurality of cases 402 arranged side-by-side. A liquid intake storage tank 406 is disposed at the top of the array 400 for gravity feeding liquid to the cases 402. A heat dissipation device 408 is provided at the bottom of the array for use in cooling the liquid after it is output from the cases. The heat dissipation device 408 can include a radiator through which the cooling liquid passes, and a fan for blowing air across the radiator for cooling the liquid.

The arrangement in FIG. 11 utilizes gravity to feed cooling liquid to the individual cases, and to discharge liquid from the cases down to the heat dissipation device 408. A pump 410 is provided to pump the liquid back up to the intake storage tank 406, or pump the liquid to an external heat dissipation device prior to being delivered to the intake storage tank 406. An optional pump 412 can also be provided for pumping the liquid to the cases from the tank 406 rather than relying solely on gravity.

Figure 18:
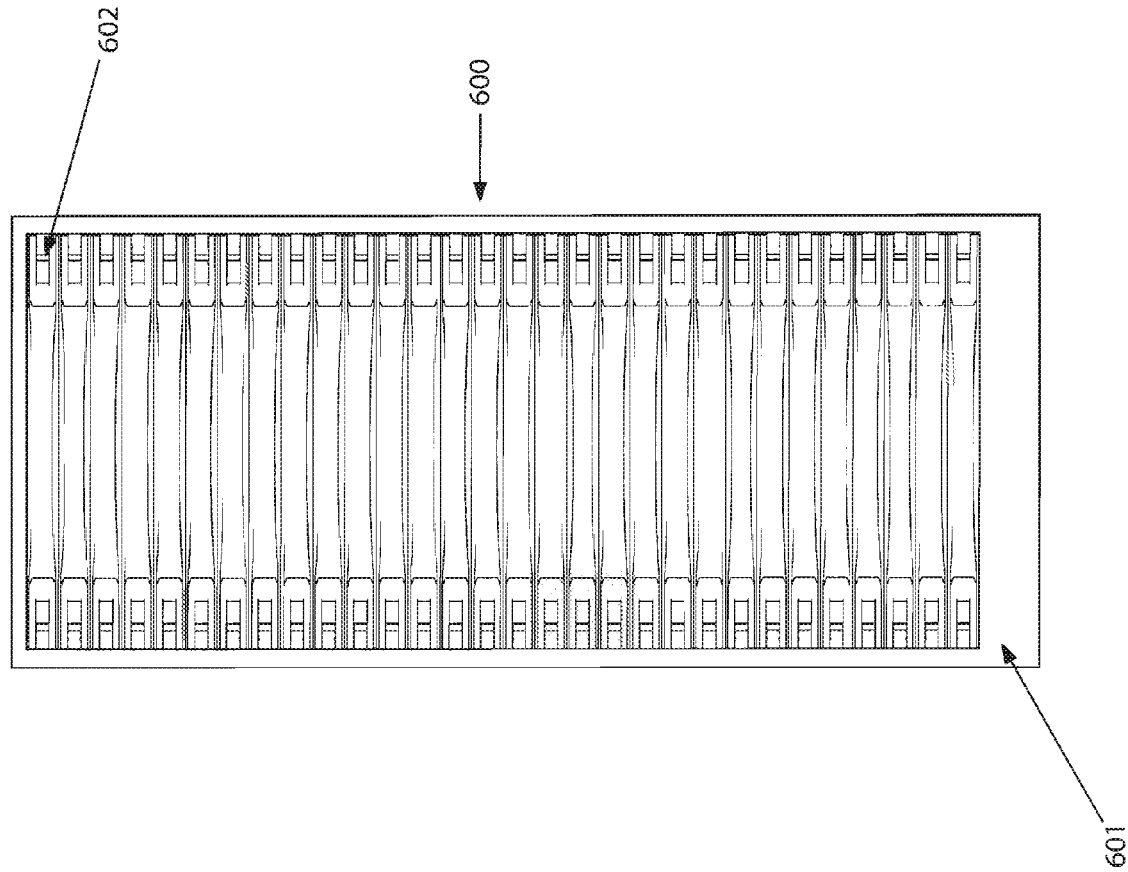
FIG. 18 is front view of another embodiment of a rack system in which the cases are oriented horizontally.

Instead of arranging the cases side-by-side (which can be referred to as a horizontal array) in a plurality of vertical levels as illustrated in FIG. 11, the individual cases can instead be oriented horizontally, with the cases stacked one above the other, which will be referred to as a vertical array. For example, FIG. 18 illustrates an array 600 that includes a plurality of horizontally-oriented cases 602 disposed one above the other in a rack 601. The cases 602 could be in abutting contact with adjacent cases, or gaps can be provided between each case. Further, the cases 602 could be separated into discrete vertical levels similar to the vertical levels described in FIG. 11.

Figure 12:
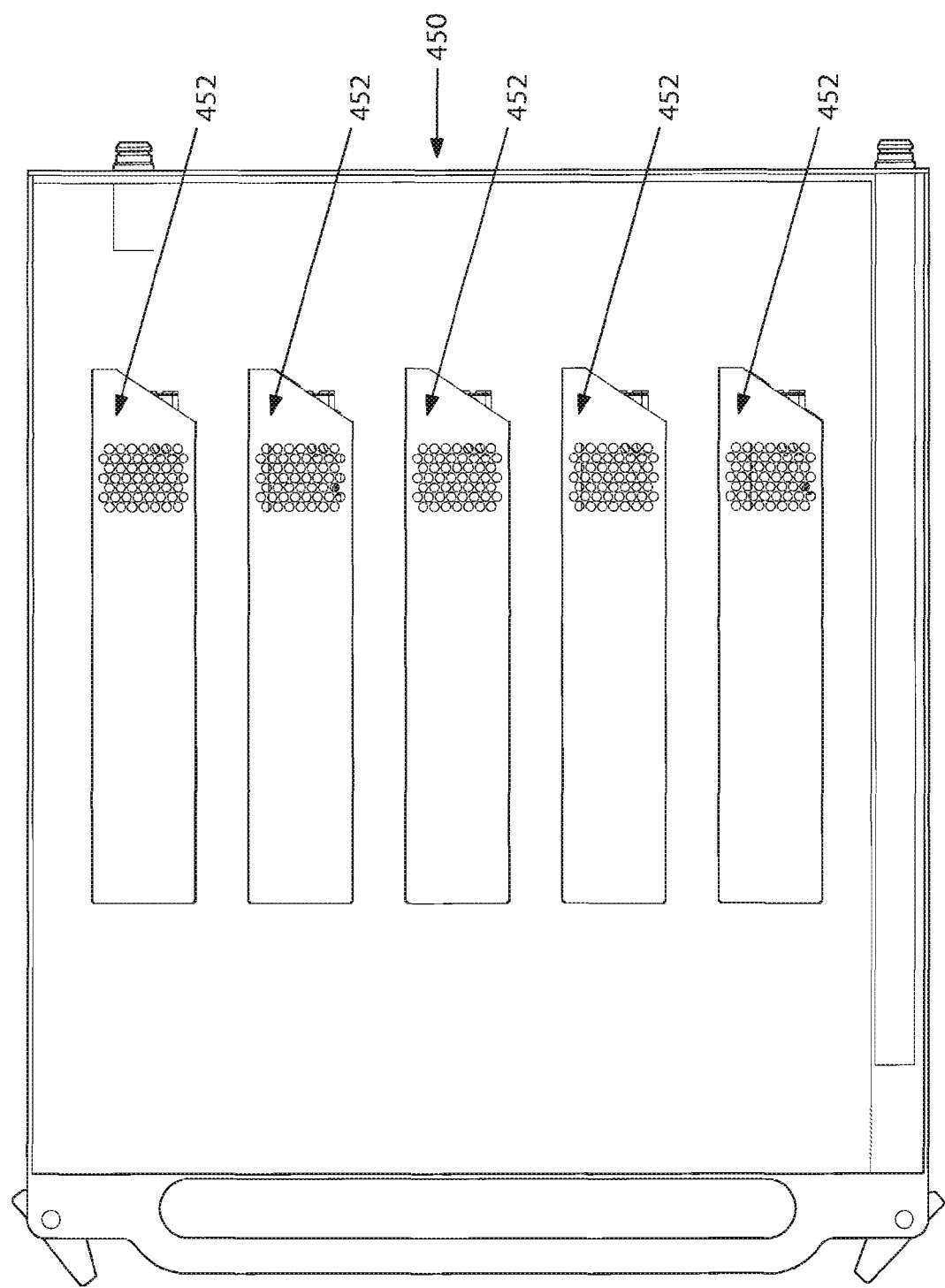
FIGS. 12-14 illustrate side views of cases that contain different types of heat generating electronics.
Figure 13:
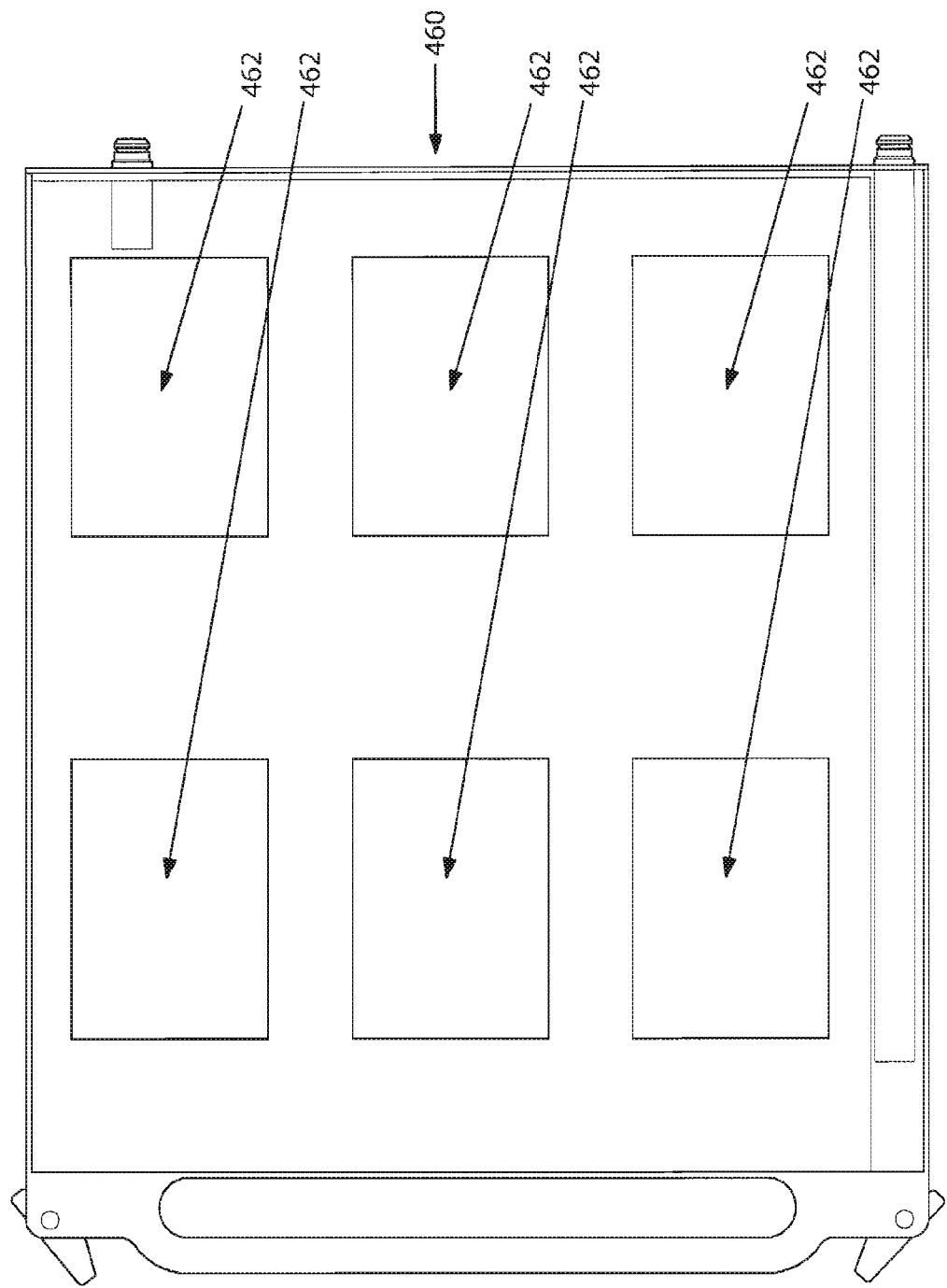
Figure 14:
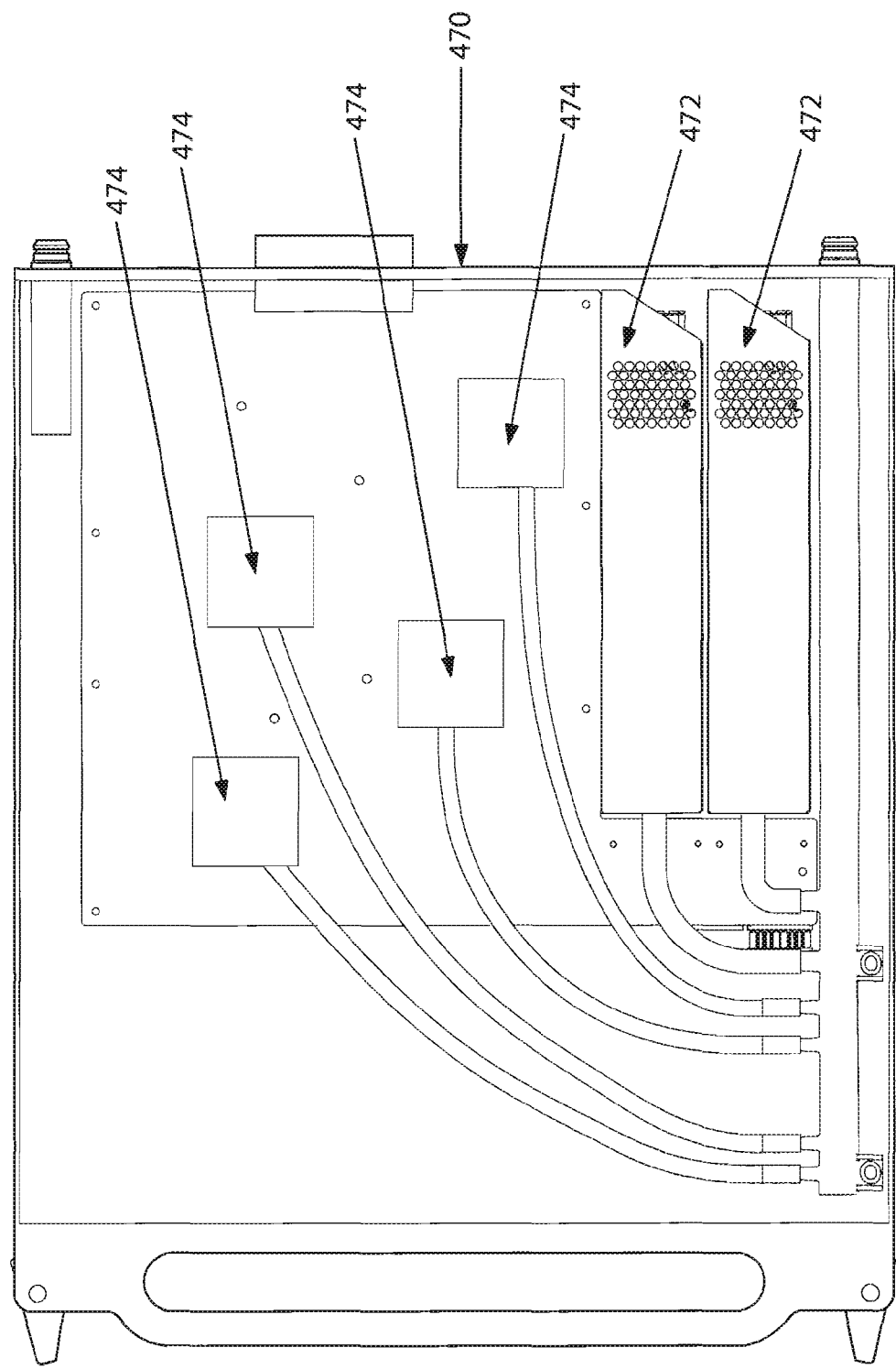

The embodiments described above referenced server cases containing server electronics. However, the concepts described herein can be applied to other electronic arrays containing other heat generating electronics. For example, FIG. 12 illustrates a power or battery case 450 containing a plurality of power sources 452. A plurality of the cases 450 arranged in an array as described herein can provide significant power resources in a relatively compact space. FIG. 13 illustrates a case 460 that can contain devices 462 such as a plurality of storage area network devices or network attached storage devices, a plurality of routers, or communication electronics. This would permit terabytes, or more, of data to be put on flash storage on a single board. FIG. 14 illustrates a case 470 where one or more power supply units 472 are disposed on a board, along with a plurality of devices 474 such as processors or memory. Since the power supply unit 472 is inside the case, this eliminates the need to pass DC power from an external source into the case. AC power could be passed into the case and the required DC power would be converted inside the case.

The dielectric liquid that is used as the cooling liquid can be any of the dielectric liquids discussed above. If desired, a colorant material can be added to the dielectric liquid to make the liquid a particular color. The colorant may also be ultra-violet light (UV)-activated. This could be used in conjunction with UV lights to make the fluid glow a particular color.

IO connections can be any type of IO connection by which electrical inputs and/or outputs are passed into and/or out of the cases. Examples of IO connections include, but are not limited to, fiber channel, Ethernet, serial attached SCSI (SAS), serial advanced technology attachment (SATA), USB, video, wireless (WIFI, RF network), temperature or other environmental monitoring.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A liquid submersion-cooled server computer array, comprising:
   a plurality of server computer cases arranged in an array, each case including:
      a plurality of walls including a lid defining a liquid-tight interior space;
      a server logic board disposed in the interior space;
      a plurality of heat generating computer components disposed on the server logic board;
      a plenum housing within the interior space; the plenum housing includes an inside space, a cooling liquid inlet port in communication with the inside space, and a cooling liquid exit opening in communication with the inside space, and the plenum housing is disposed over one of the heat generating computer components disposed on the server logic board, wherein the plenum housing contains a flow of cooling liquid that is introduced through the cooling liquid inlet port as the cooling liquid flows over the one heat generating computer component toward the cooling liquid exit opening to increase the cooling effectiveness on the one heat generating computer component;
      a dielectric cooling liquid disposed within the interior space and submerging the plurality of heat generating computer components disposed on the server logic board;
      a liquid inlet in one of the walls enabling dielectric cooling liquid to enter the case;
      a liquid outlet in one of the walls enabling dielectric cooling liquid to exit the case;
      a manifold within the interior space and fluidly connected to the liquid inlet;
      a tube within the interior space fluidly connected to the manifold and to the cooling liquid inlet port of the plenum housing to direct flow of the dielectric cooling liquid from the manifold into the plenum housing; and
      a liquid and gas-tight sealed electrical connector extending through one of the walls and electrically connected to the computer components on the server logic board;
   and
   a rack system, the plurality of server computer cases of the array are arranged on the rack system.

2. The liquid submersion-cooled server computer array of claim 1, wherein the plurality of server computer cases are arranged in a horizontal array or a vertical array on the rack system.

3. The liquid submersion-cooled server computer array of claim 1, wherein the server computer cases are individually removable from the rack system.

4. The liquid submersion-cooled server computer array of claim 1, wherein the liquid inlet and the liquid outlet each include a quick-disconnect valve that controls the flow of dielectric cooling liquid through the liquid inlet and the liquid outlet respectively; and the rack system includes an inlet manifold that engages the liquid inlet and an outlet manifold that engages the liquid outlet of each case when each case is installed in the rack system, and the inlet manifold and the outlet manifold each include a quick-disconnect valve.

5. The liquid submersion-cooled server computer array of claim 4, wherein the rack system includes a plurality of IO connectors, and the sealed electrical connectors are positioned to engage the IO connectors.

6. The liquid submersion-cooled server computer array of claim 1, wherein the rack system includes a track mechanism that guides installation of the cases onto the rack system.

7. The liquid submersion-cooled server computer array of claim 1, further comprising a lock mechanism to lock the cases to the rack system.

8. The liquid submersion-cooled server computer array of claim 1, wherein the rack system includes a liquid storage tank, a pump, and a heat dissipation device.

9. The liquid submersion-cooled server computer array of claim 1, wherein the sealed electrical connector extends through the lid, and the lid is detachably connected to the case.

10. The liquid submersion-cooled server computer array of claim 1, wherein the array is connected to a coolant liquid system that includes a thermal dissipation device or a thermal recovery device.

11. The liquid submersion-cooled server computer array of claim 1, further comprising a directed flow heat sink connected to the one heat generating computer component, and the directed flow heat sink is disposed within the inside space of the plenum housing.

12. The liquid submersion-cooled server computer array of claim 1, including a liquid coolant flow path in communication with the cases, and the liquid coolant flow path is in heat exchanging relationship with a water cooling loop for cooling liquid coolant flowing in the flow path.

13. A liquid submersion-cooled server computer that is removably attachable in a server computer array, comprising:
   a housing defining a liquid-tight interior space;
   a liquid inlet in a wall of the housing, the liquid inlet including a quick-connect valve that controls the flow of liquid through the liquid inlet when the server computer is removed from the server computer array;
   a liquid outlet in the wall of the housing, the liquid outlet including a quick-connect valve that controls the flow of liquid through the liquid outlet when the server computer is removed from the server computer array;

a server logic board disposed in the interior space of the housing, and heat generating electronic devices disposed on the server logic board;

a plenum housing within the interior space; the plenum housing includes an inside space, a cooling liquid inlet port in communication with the inside space, and a cooling liquid exit opening in communication with the inside space, and the plenum housing is disposed over one of the heat generating electronic devices disposed on the server logic board, wherein the plenum housing contains a flow of cooling liquid that is introduced through the cooling liquid inlet port as the cooling liquid flows over the one heat generating electronic devices toward the cooling liquid exit opening to increase the cooling effectiveness on the one heat generating electronic device;

a dielectric cooling liquid disposed within the interior space and submerging the plurality of heat generating electronic devices disposed on the server logic board;

a manifold within the interior space and fluidly connected to the liquid inlet;

a tube within the interior space fluidly connected to the manifold and to the plenum housing to direct flow of the dielectric cooling liquid from the manifold into the plenum housing;

a heat sink enveloped by the plenum and connected to the one heat generating electronic device; and a liquid and gas-tight sealed IO connector extending through a wall of the housing and electrically connected to the electronic devices on the server logic board.

14. The liquid submersion-cooled server computer of claim 13, wherein the liquid inlet and the liquid outlet are in a back wall of the housing or a bottom wall of the housing.

15. The liquid submersion-cooled server computer of claim 13, wherein the heat generating electronic devices comprise server electronics or processors.

16. The liquid submersion-cooled server computer of claim 13, wherein the sealed IO connector extends through a back wall of the housing or a top wall of the housing.

17. The liquid submersion-cooled server computer of claim 15, comprising a plurality of server logic boards disposed within the interior space.

18. The liquid submersion-cooled server computer of claim 13, wherein the heat generating electronic devices comprise a power supply.

* * * * *